(12) United States Patent
Upadhya et al.

(10) Patent No.: US 6,986,382 B2
(45) Date of Patent: Jan. 17, 2006

(54) INTERWOVEN MANIFOLDS FOR PRESSURE DROP REDUCTION IN MICROCHANNEL HEAT EXCHANGERS

(75) Inventors: Girish Upadhya, San Jose, CA (US); Thomas W. Kenny, San Carlos, CA (US); Peng Zhou, Albany, CA (US); Mark Munch, Los Altos, CA (US); James Gill Shook, Santa Cruz, CA (US); Kenneth Goodson, Belmont, CA (US); David Corbin, Los Altos, CA (US)

(73) Assignee: Cooligy Inc., Mountain View, CA (US)

( * ) Notice: Subject to any disclaimer, the term of this patent is extended or adjusted under 35 U.S.C. 154(b) by 0 days.

(21) Appl. No.: 10/439,912

(22) Filed: May 16, 2003

(65) Prior Publication Data

US 2004/0104010 A1 Jun. 3, 2004

Related U.S. Application Data

(60) Provisional application No. 60/423,009, filed on Nov. 1, 2002, provisional application No. 60/442,383, filed on Jan. 24, 2003, and provisional application No. 60/455,729, filed on Mar. 17, 2003.

(51) Int. Cl.
F28F 7/00 (2006.01)

(52) U.S. Cl. .............................. 165/80.4; 165/104.33; 165/404.21; 361/700; 257/715; 174/15.1

(58) Field of Classification Search ............... 165/50.4, 165/185, 107.21, 104.33; 361/699, 700; 174/15.1; 257/714–716
See application file for complete search history.

(56) References Cited

U.S. PATENT DOCUMENTS

,596,062 A 12/1897 Firey
2,039,593 A 5/1936 Hubbuch et al.
2,273,505 A 2/1942 Florian (Continued)

FOREIGN PATENT DOCUMENTS

| CN | 97212126.9 | 3/1997 |
|---|---|---|
| JP | 1-256775 | 10/1989 |
| JP | 10-99592 | 4/1998 |
| JP | 2000-277540 | 10/2000 |
| JP | 2001-326311 | 11/2001 |

OTHER PUBLICATIONS

Jaisree Moorthy et al., *Active control of electroosmotic flow in microchannels using light,* Jan. 26, 2001, Sensors and Actuators B 75, pp. 223–229.

Andreas Manz et al., *Electroosmotic pumping and electrophoretic separations for miniaturized chemical analysis systems,* Sep. 16, 1994, J.Micromech. Microeng. 4 (1994), pp. 257–265, printed in the U.K.

E. B. Cummings et al., *Irrotationality of uniform electroosmosis,* Sep. 1999, Part of the SPIE Conference on Microfluidic Devices and Systems II, SPIE vol. 3877, pp. 180–189.

(Continued)

*Primary Examiner*—Terrell McKinnon
(74) *Attorney, Agent, or Firm*—Haverstock & Owens LLP

(57) ABSTRACT

A microchannel heat exchanger coupled to a heat source and configured for cooling the heat source comprising a first set of fingers for providing fluid at a first temperature to a heat exchange region, wherein fluid in the heat exchange region flows toward a second set of fingers and exits the heat exchanger at a second temperature, wherein each finger is spaced apart from an adjacent finger by an appropriate dimension to minimize pressure drop in the heat exchanger and arranged in parallel. The microchannel heat exchanger includes an interface layer having the heat exchange region. Preferably, a manifold layer includes the first set of fingers and the second set of fingers configured within to cool hot spots in the heat source. Alternatively, the interface layer includes the first set and second set of fingers configured along the heat exchange region.

96 Claims, 14 Drawing Sheets

U.S. PATENT DOCUMENTS

| | | |
|---|---|---|
| 3,361,195 A | 1/1968 | Meyerhoff et al. |
| 3,771,219 A | 11/1973 | Tui et al. |
| 3,817,321 A | 6/1974 | von Cube et al. |
| 3,923,426 A | 12/1975 | Theeuwes |
| 3,948,316 A | 4/1976 | Souriau |
| 4,109,707 A | 8/1978 | Wilson et al. |
| 4,211,208 A | 7/1980 | Lindner |
| 4,312,012 A | 1/1982 | Frieser et al. ............... 357/82 |
| 4,450,472 A | 5/1984 | Tuckerman et al. .......... 357/82 |
| 4,485,429 A | 11/1984 | Mittal |
| 4,516,632 A | 5/1985 | Swift et al. ................. 165/167 |
| 4,561,040 A | 12/1985 | Eastman et al. ............. 361/385 |
| 4,567,505 A | 1/1986 | Pease et al. ................. 357/81 |
| 4,573,067 A | 2/1986 | Tuckerman et al. .......... 357/82 |
| 4,574,876 A | 3/1986 | Aid |
| 4,644,385 A | 2/1987 | Nakanishi et al. |
| 4,758,926 A | 7/1988 | Herrell et al. ............. 361/385 |
| 4,866,570 A | 9/1989 | Porter |
| 4,868,712 A | 9/1989 | Woodman ................... 361/388 |
| 4,893,174 A | 1/1990 | Yamada et al. |
| 4,894,709 A | 1/1990 | Phillips et al. ............... 357/82 |
| 4,896,719 A | 1/1990 | O'Neill et al. .............. 165/170 |
| 4,908,112 A | 3/1990 | Pace ..................... 204/299 R |
| 4,938,280 A | 7/1990 | Clark ......................... 165/80.4 |
| 5,016,090 A * | 5/1991 | Galyon et al. ............... 257/714 |
| 5,016,138 A | 5/1991 | Woodman ................... 361/381 |
| 5,043,797 A | 8/1991 | Lopes |
| 5,057,908 A | 10/1991 | Weber ......................... 357/81 |
| 5,070,040 A | 12/1991 | Pankove ..................... 437/209 |
| 5,083,194 A | 1/1992 | Bartilson ..................... 357/81 |
| 5,088,005 A | 2/1992 | Ciaccio |
| 5,096,388 A | 3/1992 | Weinberg |
| 5,099,311 A | 3/1992 | Bonde et al. ................. 357/82 |
| 5,099,910 A | 3/1992 | Walpole et al. ............. 165/80.4 |
| 5,125,451 A | 6/1992 | Matthews ................... 165/80.4 |
| 5,131,233 A | 7/1992 | Cray et al. ..................... 62/64 |
| 5,161,089 A | 11/1992 | Chu et al. |
| 5,179,500 A | 1/1993 | Koubek et al. ............. 361/385 |
| 5,203,401 A | 4/1993 | Hamburgen et al. ........ 165/80.4 |
| 5,218,515 A | 6/1993 | Bernhardt ................... 361/385 |
| 5,219,278 A | 6/1993 | Van Lintel |
| 5,228,502 A | 7/1993 | Chu et al. |
| 5,230,564 A | 7/1993 | Bartilson et al. ............ 374/178 |
| 5,232,047 A | 8/1993 | Matthews ................... 165/168 |
| 5,239,200 A | 8/1993 | Messina et al. ............. 257/714 |
| 5,239,443 A | 8/1993 | Fahey et al. |
| 5,263,251 A | 11/1993 | Matthews ............... 29/840.036 |
| 5,265,670 A | 11/1993 | Zingher |
| 5,269,372 A * | 12/1993 | Chu et al. ................... 165/80.4 |
| 5,274,920 A | 1/1994 | Matthews ............... 29/890.039 |
| 5,281,026 A | 1/1994 | Bartilson et al. ............ 374/143 |
| 5,309,319 A | 5/1994 | Messina ..................... 361/699 |
| 5,310,440 A * | 5/1994 | Zingher ................. 156/345.11 |
| 5,316,077 A | 5/1994 | Reichard |
| 5,317,805 A | 6/1994 | Hoopman et al. ........ 29/890.03 |
| 5,325,265 A | 6/1994 | Turlik et al. ................. 361/702 |
| 5,336,062 A | 8/1994 | Richter |
| 5,380,956 A | 1/1995 | Loo et al. |
| 5,383,340 A | 1/1995 | Larson et al. ............... 62/259.2 |
| 5,386,143 A | 1/1995 | Fitch |
| 5,388,635 A * | 2/1995 | Gruber et al. ............. 165/80.4 |
| 5,427,174 A | 6/1995 | Lomolino, Sr. et al. ......... 165/1 |
| 5,436,793 A | 7/1995 | Sanwo et al. ............... 361/689 |
| 5,459,099 A | 10/1995 | Hsu ........................... 437/180 |
| 5,490,117 A | 2/1996 | Oda et al. |
| 5,508,234 A | 4/1996 | Dusablon, Sr. et al. ...... 437/228 |
| 5,514,832 A | 5/1996 | Dusablon, Sr. et al. .... 174/15.1 |
| 5,514,906 A | 5/1996 | Love et al. ................. 257/712 |
| 5,544,696 A | 8/1996 | Leland |
| 5,548,605 A | 8/1996 | Benett et al. |
| 5,575,929 A | 11/1996 | Yu et al. ....................... 216/10 |
| 5,585,069 A | 12/1996 | Zanzucchi et al. |
| 5,641,400 A | 6/1997 | Kaltenbach et al. ...... 210/198.2 |
| 5,658,831 A | 8/1997 | Layton et al. |
| 5,675,473 A | 10/1997 | McDunn et al. |
| 5,692,558 A | 12/1997 | Hamilton et al. ........... 165/80.4 |
| 5,696,405 A | 12/1997 | Weld ......................... 257/714 |
| 5,703,536 A | 12/1997 | Davis et al. ................. 330/289 |
| 5,704,416 A | 1/1998 | Larson et al. ........... 165/104.33 |
| 5,727,618 A | 3/1998 | Mundinger et al. ........ 165/80.4 |
| 5,740,013 A | 4/1998 | Roesner et al. |
| 5,759,014 A | 6/1998 | Van Lintel |
| 5,763,951 A | 6/1998 | Hamilton et al. |
| 5,768,104 A | 6/1998 | Salmonson et al. |
| 5,774,779 A | 6/1998 | Tuchinskiy ..................... 419/2 |
| 5,800,690 A | 9/1998 | Chow et al. |
| 5,801,442 A | 9/1998 | Hamilton et al. ........... 257/714 |
| 5,835,345 A | 11/1998 | Staskus et al. |
| 5,836,750 A | 11/1998 | Cabuz |
| 5,858,188 A | 1/1999 | Soane et al. |
| 5,863,708 A | 1/1999 | Zanzucchi et al. |
| 5,869,004 A | 2/1999 | Parce et al. |
| 5,870,823 A | 2/1999 | Bezama et al. |
| 5,874,795 A | 2/1999 | Sakamoto |
| 5,876,655 A | 3/1999 | Fisher |
| 5,880,017 A | 3/1999 | Schwiebert et al. |
| 5,880,524 A | 3/1999 | Xie |
| 5,901,037 A | 5/1999 | Hamilton et al. |
| 5,921,087 A | 7/1999 | Bhatia et al. |
| 5,936,192 A | 8/1999 | Tauchi |
| 5,940,270 A | 8/1999 | Puckett |
| 5,942,093 A | 8/1999 | Rakestraw et al. |
| 5,964,092 A | 10/1999 | Tozuka et al. |
| 5,965,001 A | 10/1999 | Chow et al. |
| 5,965,813 A | 10/1999 | Wan et al. |
| 5,978,220 A | 11/1999 | Frey et al. |
| 5,993,750 A | 11/1999 | Ghosh et al. |
| 5,997,713 A | 12/1999 | Beetz, Jr. et al. |
| 5,998,240 A | 12/1999 | Hamilton et al. |
| 6,007,309 A | 12/1999 | Hartley |
| 6,010,316 A | 1/2000 | Haller et al. |
| 6,013,164 A | 1/2000 | Paul et al. |
| 6,019,165 A * | 2/2000 | Batchelder ................. 165/80.3 |
| 6,019,882 A | 2/2000 | Paul et al. |
| 6,034,872 A * | 3/2000 | Chrysler et al. ............. 361/699 |
| 6,039,114 A * | 3/2000 | Becker et al. .............. 165/170 |
| 6,054,034 A | 4/2000 | Soane et al. ................. 204/601 |
| 6,068,752 A | 5/2000 | Dubrow et al. |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A | 8/2000 | Fuesser et al. |
| 6,119,729 A | 9/2000 | Oberholzer et al. |
| 6,126,723 A | 10/2000 | Drost et al. |
| 6,129,145 A | 10/2000 | Yamamoto et al. |
| 6,131,650 A | 10/2000 | North et al. ................. 165/170 |
| 6,140,860 A | 10/2000 | Sandhu et al. |
| 6,146,103 A | 11/2000 | Lee et al. |
| 6,154,363 A | 11/2000 | Chang |
| 6,159,353 A | 12/2000 | West et al. |
| 6,167,948 B1 | 1/2001 | Thomas |
| 6,171,067 B1 | 1/2001 | Parce |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,206,022 B1 | 3/2001 | Tsai et al. |
| 6,210,986 B1 | 4/2001 | Arnold et al. |
| 6,221,226 B1 | 4/2001 | Kopf-Sill |
| 6,234,240 B1 | 5/2001 | Cheon ......................... 165/80.3 |
| 6,238,538 B1 | 5/2001 | Parce et al. ................. 204/600 |
| 6,253,835 B1 | 7/2001 | Chu et al. |

| | | |
|---|---|---|
| 6,257,320 B1 * | 7/2001 | Wargo ........................ 165/80.4 |
| 6,277,257 B1 | 8/2001 | Paul et al. ................... 204/450 |
| 6,301,109 B1 | 10/2001 | Chu et al. |
| 6,313,992 B1 | 11/2001 | Hildebrandt |
| 6,317,326 B1 | 11/2001 | Vogel et al. |
| 6,321,791 B1 | 11/2001 | Chow |
| 6,322,753 B1 | 11/2001 | Lindberg et al. |
| 6,324,058 B1 | 11/2001 | Hsiao |
| 6,337,794 B1 * | 1/2002 | Agonafer et al. ........... 361/690 |
| 6,351,384 B1 | 2/2002 | Daikoku et al. |
| 6,366,462 B1 * | 4/2002 | Chu et al. ................... 361/699 |
| 6,366,467 B1 | 4/2002 | Patel et al. |
| 6,388,317 B1 | 5/2002 | Reese ......................... 257/713 |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. .................. 165/748 |
| 6,431,260 B1 * | 8/2002 | Agonafer et al. .......... 165/80.4 |
| 6,437,981 B1 | 8/2002 | Newton et al. |
| 6,444,461 B1 | 9/2002 | Knapp et al. |
| 6,457,515 B1 | 10/2002 | Vafai et al. |
| 6,459,581 B1 | 10/2002 | Newton et al. |
| 6,477,045 B1 | 11/2002 | Wang |
| 6,492,200 B1 | 12/2002 | Park et al. |
| 6,537,437 B1 | 3/2003 | Galambos et al. |
| 6,578,626 B1 | 6/2003 | Calaman et al. |
| 6,591,625 B1 | 7/2003 | Simon |
| 6,600,220 B2 | 7/2003 | Barber et al. |
| 6,606,251 B1 | 8/2003 | Kenny, Jr. et al. |
| 6,632,655 B1 | 10/2003 | Mehta et al. |
| 6,632,719 B1 | 10/2003 | DeBoer et al. ............. 438/381 |
| 6,729,383 B1 | 5/2004 | Cannell et al. |
| 6,743,664 B2 | 6/2004 | Liang et al. |
| 2001/0016985 A1 | 8/2001 | Insley et al. |
| 2001/0024820 A1 | 9/2001 | Mastromatteo et al. |
| 2001/0055714 A1 | 12/2001 | Cettour-Rose et al. |
| 2002/0011330 A1 | 1/2002 | Insley et al. |
| 2002/0075645 A1 | 6/2002 | Kitano et al. |
| 2002/0121105 A1 | 9/2002 | McCarthy, Jr. et al. |
| 2002/0134543 A1 | 9/2002 | Estes et al. |
| 2003/0062149 A1 | 4/2003 | Goodson et al. |
| 2003/0121274 A1 | 7/2003 | Wightman |
| 2003/0213580 A1 * | 11/2003 | Philpott et al. ............... 165/46 |
| 2004/0040695 A1 | 3/2004 | Chesser et al. |
| 2004/0052049 A1 | 3/2004 | Wu et al. |
| 2004/0089008 A1 | 5/2004 | Tilton et al. |
| 2004/0125561 A1 | 7/2004 | Gwin et al. |
| 2004/0160741 A1 | 8/2004 | Moss et al. |
| 2004/0188069 A1 | 9/2004 | Tomioka et al. |

OTHER PUBLICATIONS

Stephen C. Jacobson et al., *Fused Quartz Substrates for Microchip Electrophoresis*, Jul. 1, 1995, Analytical Chemistry, vol. 67, No. 13, pp. 2059–2063.

Haim H. Bau, *Optimization of conduits' shape in micro heat exchangers*, Dec. 10, 1997, International Journal of Heat and Mass Transfer 41 (1998), pp. 2717–2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405–410.

M. B. Bowers et al., *Two–Phase Electronic Cooling Using Mini–Channel and Micro–Channel Heat Sinks: Part 2–Flow Rate and Pressure Drop Constraints*, Dec. 1994, Journal of Electronic Packaging 116, pp. 298–305.

Meint J. de Boer et al., *Micromachining of Buried Micro Channels in Silicon*, Mar. 2000, Journal of Microelectromechanical systems, vol. 9, No. 1, pp. 94–103.

S. B. Choi et al., *Fluid Flow and Heat Transfer in Microtubes*, 1991, DSC–vol. 32, Micromechanical sensors, Actuators, and Systems, ASME 1991, pp. 123–134.

S. F. Choquette, M. Faghri et al., *Optimum Design of Microchannel Heat Sinks*, 1996, DSC–vol. 59, Microelectromechanical Systems (MEMS), ASME 1996, pp. 115–126.

David Copeland et al., *Manifold Microchannel Heat Sinks: Theory and Experiment*, 1995, EEP–vol. 10–2, Advances in Electronic Packaging ASME 1995, pp. 829–835.

J. M. Cuta et al., *Forced Convection Heat Transfer in Parallel Channel Array Microchannel Heat Exchanger*, 1996, PID–vol. 27 HTD–vol. 338, Advances in Energy efficiency, Heat/Mass Transfer Enhancement, ASME 1996, pp. 17–23.

K. Fushinobu et al., *Heat Generation and Transport in Sub–Micron Semiconductor Devices*, 1993, HTD–vol. 253, Heat Transfer on the Microscale, ASME 1993, pp. 21–28.

Charlotte Gillot et al., *Integrated Micro Heat Sink for Power Multichip Module*, Sep. 3, 1999, IEEE Transactions on Industry Applications, vol. 36. No. 1. Jan./Feb. 2000, pp. 217–221.

John Gooding, *Microchannel heat exchangers—a review*, SPIE vol. 1997 High Heat Flux Engineering II (1993), pp. 66–82.

Koichiro Kawano et al., *Micro Channel Heat Exchanger for Cooling Electrical Equipment*, HTD–vol. 361–3/PID–vol. 3, Proceedings of the ASME Heat Transfer Division—vol. 3, ASME 1998, pp. 173–188.

Chad Harris et al., *Design and Fabrication of a Cross Flow Micro Heat Exchanger*, Dec. 2000, Journal of Microelectromechanical Systems, vol. 9, No. 4, pp. 502–508.

George M. Harpole et al., *Micro–Channel Heat Exchanger Optimization*, 1991, Seventh IEEE Semi–Therm Symposium, pp. 59–63.

Pei–Xue Jiang et al., *Thermal–hydraulic performance of small scale micro–channel and prous–media heat–exchangers*, 2001, International Journal of Heat and Mass Transfer 44 (2001), pp. 1039–1051.

X.N. Jiang et al., *Laminar Flow Through Microchannels Used for Microscale Cooling Systems*, 1997, IEEE/CPMT Electronic Packaging Technology Conference, pp. 119–122, Singapore.

David Bazeley Tuckerman, *Heat–Transfer Microstructures for Integrated Circuits*, Feb. 1984, pp. ii–xix, pp. 1–141.

E. Esashi, *Silicon micromachining for integrated microsystems*, 1996, Vacuum/vol. 47/Nos. 6–8, pp. 469–474.

T.S. Raviguruajan et al., *Effects of Heat Flux of Two–Phase Flow characteristics of Refrigerant Flows in a Micro–Channel Heat Exchanger*, HTD–vol. 329, National Heat Transfer Conference, vol. 7, ASME 1996, pp. 167–178.

T.S. Ravigruruajan et al., *Single–Phase Flow Thermal Performance Characteristics of a Parallel Micro–Channel Heat Exchanger*, 1996, HTD–vol. 329, National Heat Transfer Conference, vol. 7, ASME 1996, pp. 157–166.

T.S. Raviguruajan et al., *Liquid Flow Characteristics in a Diamond–Pattern Micro–Heat–Exchanger*, DSC–vol. 59 Microelectromechanical Systems (MEMS), ASME 1996, pp. 159–166.

T.S. Raviguruajan, *Impact of Channel Geometry on Two–Phase Flow Heat Transfer Characteristics of Refrigerants in Microchannel Heat Exchangers*, May 1998, Journal of Heat Transfer, vol. 120, pp. 485–491.

J. Pfahler et al., *Liquid Transport in Micron and Submicron Channels,* Mar. 1990, Sensors and Actuators, A21–A23 (1990), pp. 431–434.

Kenneth Pettigrew et al., *Performance of a MEMS based Micro Capillary Pumped Loop for Chip–Level Temperature Control,* 2001, The 14$^{th}$ IEEE International Conference on Micro Electro Mechanical Systems, pp. 427–430.

C. Perret et al., *Microchannel integrated heat sinks in silicon technology,* Oct. 12–15, 1998, The 1998 IEEE Industry Applications Conference, pp. 1051–1055.

X.F. Peng et al., *Convective heat transfer and flow friction for water flow in microchannel structures,* 1996, Int. J. Heat Mass Transfer, vol. 39, No. 12, pp. 2599–2608, printed in Great Britain.

X.F. Peng et al., *Experimental investigation of heat transfer in flat plates with rectangular microchannels,* 1994, Int. J. Heat Mass Transfer, vol. 38, No. 1, pp. 127–137, printed in Great Britain.

X.F. Peng et al., *Cooling Characteristics with Microchanneled Structures,* 1994, Enhanced Heat Transfer, vol. 1, No. 4, pp. 315–326, printed in the United States of America.

Yoichi Murakami et al., *Parametric Optimization of Multi-channeled Heat Sinks for VLSI Chip Cooling,* Mar. 2002, IEEE Transaction on Components and Packaging Technologies, vol. 24, No. 1, pp. 2–9.

D. Mundinger et al., *High average power 2–D laser diode arrays or silicon microchannel coolers,* CLEO '89/Friday Morning/404.

L.J. Missaggia et al., *Microchannel Heat Sinks for Two–Dimensional High–Power–Density Diode Laser Arrays,* 1989, IEEE Journal of Quantum Electronics, vol. 25, No 9, Sep. 1989, pp. 1989–1992.

M.J. Marongiu et al., *Enhancement of Multichip Modules (MCMs) Cooling by Incorporating MicroHeatPipes and Other High Thermal Conductivity Materials into Microchannel Heat Sinks,* 1998, Electronic Components and Technology Conference, pp. 45–50.

C.R. Friedrich et al., *Micro heat exchangers fabricated by diamond machining,* Jan. 1994, Precision Engineering, vol. 16, No. 1, pp. 56–59.

Mali Mahalingam, *Thermal Management in Semiconductor Device Packaging,* 1985, Proceedings of the IEEE, vol. 73, No. 9, Sep. 1985, pp. 1396–1404.

T.M. Adams et al., *An experimental investigation of single–phase forced convection in microchannels,* 1997, Int. J. Heat Mass Transfer, vol. 41, Nos. 6–7, pp. 851–857, Printed in Great Britain.

T.M. Adams et al., *Applicability of traditional turbulent single–phase forced convection correlations to non–circular micrhchannels,* 1999, Int. J. Heat and Transfer 42, (1999) pp. 4411–4415.

Bassam Badran et al., *Experimental Results for Low–Temperature Silicon Micromachined Micro Heat Pipe Arrays Using Water and Methanol as Working Fluids,* May 31, 1997, Experimental Heat Transfer, 10: pp. 253–272.

D. Jed Harrison et al., *Electroosmotic Pumping Within a Chemical Sensor System Integrated on Silicon,* Session C9 Chemical Sensors and Systems for Liquids, Jun. 26, 1991, pp. 792–795.

Kurt Seller et al., *Electroosmotic Pumping and Valveless Control of Fluid Flow within a Manifold of Capillaries on a Glass Chip,* 1994, Analytical Chemistry, vol. 66, No. 20, Oct. 15, 1994, pp. 3485–3491.

Philip H. Paul et al., *Electrokinetic Generation of High Pressures Using Porous Microstructures,* 1998, Micro–Total Analysis Systems, pp. 49–52.

Gh. Mohiuddin Mala et al., *Flow characteristics of water through a microchannel between two parallel plates with electrokinetic effects,* 1997, Int. J. Heat and Fluid Flow, vol. 18, No. 5, pp. 489–496.

W.E. Morf et al., *Partial electroosmotic pumping in complex capillary systems Part 1: Principles and general theoretical approach,* Oct. 16, 2000, Sensors and Actuators B 72 (2001), pp. 266–272.

M. Esashi, *Silicon micromachining and micromechanics,* Sep. 1, 1993, Wear, vol. 168, No. 1–2, (1993), pp. 181–187.

Stephanus Buttgenbach et al., *Microflow devices for miniaturized chemical analysis systems,* Nov. 4–5, 1998, SPIE–Chemical Microsensors and Applications, vol. 3539, pp. 51–61.

Sarah Arunlanandam et al., *Liquid transport in rectangular–microchannels by electroosmotic pumping,* 2000, Colloids and Surfaces A: Physicochemical and Engineering Aspects vol. 161 (2000), pp. 89–102.

Linan Jiang et al., *Closed–Loop Electroosmotic Microchannel Cooling System for VLSI Circuits,* Mechanical Engineering Dept. Stanford University, pp. 1–27.

Susan L. R. Barker et al., *Fabrication, Derivatization and Applications of Plastic Microfluidic Devices,* Proceedings of SPIE, vol. 4205. Nov. 5–8, 2000, pp. 112–118.

Timothy E. McKnight et al., *Electrochemically induced Hydraulic Pumping with Integrated Electrodes on Microfluidic Devices,* 2001, Anal. Chem. vol. 73, pp. 4045–4049.

Chris Bourne, *Cool Chips pic Receives Nanotech Manufacturing Patent,* Jul. 31, 2002, pp. 1–2.

Frank Wagner et al., *Electroosmotic Flow Control in Micro Channels Produced by Scanning Excimer Laser Ablation,* 2000, Proceedings of SPIE vol. 4088, Jun. 14–16, 2000, pp. 337–340.

H. A. Goodman, *Data Processor Cooling With Connection To Maintain Flow Through Standby Pump,* Dec. 1983, IBM Technical Disclosure Bulletin, vol. 26, No. 7A, p. 3325.

*Electroerosion Micropump,* May 1990, IBM Technical Disclosure Bulletin, vol. 32, No. 12, pp. 342–343.

Shulin Zeng et al., *Fabrication and Characterization of Electrokinetic Micro Pumps,* 2000 Inter Society Conference on Thermal Phenomena, pp. 31–35.

A. Manz et al., *Integrated Electroosmotic Pumps and Flow Manifolds for Total Chemical Analysis System,* 1991, Inter. Conf. on Solid–State Sensors and Actuators, pp. 939–941.

O. T. Guenat et al., *Partial electroosmotic pumping in complex capillary systems Part: 2 Fabrication and application of a micro total analysis system suited for continuous volumetric nanotitrations,* Oct. 16, 2000, Sensors and Actuators B 72 (2001) pp. 273–282.

J. G. Sunderland, *Electrokinetic dewatering and thickening. I. Introduction and historical review of electrokinetic applications,* Sep. 1987, Journal of Applied Electrochemistry vol. 17, No. 5, pp. 889–898.

J. C. Rife et al., *Acousto– and electroosmotic microfluidic controllers,* 1998 Microfluidic Devices and Systems, vol. 3515, pp. 125–135.

Purnendu K Dasgupta et al., *Electroosmosis: A Reliable Fluid Propulsion System for Flow Injection Analysis,* 1994, Anal. Chem., vol. 66, No. 11, pp. 1792–1798.

Ray Beach et al., *Modular Microchannel Cooled Heatsinks for High Average Power Laser Diode Arrays,* Apr. 1992, IEEE Journal of Quantum Electronics, vol. 28, No. 4, pp. 966–976.

Roy W. Knight et al., *Optimal Thermal Design of Air cooled Forced Convection finned Heat Sinks—Experimental Verification,* Oct. 1992, IEEE Transactions on Components, Hybrids, and Manufacturing Technology, vol. 15, No. 5 pp. 754–760.

Y. Zhuang et al., *Experimental study on local heat transfer with liquid impingement flow in two–dimensional micro–channels,* 1997, Int. J. Heat Mass Transfer, vol. 40, No. 17, pp. 4055–4059.

D. Yu et al., *An Experimental and Theoretical Investigation of Fluid Flow and Heat Transfer in Microtube,* 1995, ASME/JSME Thermal Engineering Conference, vol. 1, pp. 523–530.

Xiaoqing Yin et al., *Micro Heat Exchangers Consisting of Pin Arrays,* 1997, Journal of Electronic Packaging Mar. 1997, vol. 119, pp. 51–57.

X. Yin et al., *Uniform Channel Micro Heat Exchangers,* 1997, Journal of Electronic Packaging Jun. 1997, vol. 119, No. 2, pp. 89–94.

Chun Yang et al., *Modeling forced liquid convection in rectangular microchannels with electrokinetic effect,* 1998, International Journal of Heat and Mass Transfer 41 (1998), pp. 4229–4249.

Arel Weisberg et al., *Analysis of microchannels for integrated cooling,* 1992, Int. J. Heat Mass Transfer, vol. 35, No. 10, pp. 2465–2473.

Roger S. Stanley et al., *Two–Phase Flow in Microchannels,* 1997, DSE–vol. 62/HTD–vol. 354, MEMS, pp. 143–152.

B. X. Wang et al., *Experimental investigation on liquid forced–convection heat transfer through microchannels,* 1994, Int. J. Heat Mass Transfer, vol. 37 Suppl. 1, pp. 73–82.

Kambiz Vafai et al., *Analysis of two–layered micro–channel heat sink concept in electronic cooling,* 1999, Int. J. Heat Mass Transfer, 42 (1999), pp. 2287–2297.

Gokurk Tune et al., *Heat transfer in rectangular microchannels,* 2002, Int. J. Heat Mass Transfer, 45 (2002), pp. 765–773.

D. B. Tuckerman et al., *High–Performance Heat Sinking for VLSI,* 1981, IEEE Electron Device Letters, vol. EDL–2, No. 5, pp. 126–129.

Bengt Sunden et al., *An Overview of Fabrication Methods and Fluid Flow and Heat Transfer Characteristics of Micro Channels,* pp. 3–23.

David S. Shen et al., *Micro Heat Spreader Enhance Heat Transfer in MCMs,* 1995, IEEE Multi–Chip Module Conference, pp. 189–194.

S. Sasaki et al., *Optimal Structure for Microgrooved Cooling Fin for High–Power LSI Devices,* Electronic Letters, Dec. 4, 1986, vol. 22, No. 25.

Vijay K. Samalam, *Convection Heat Transfer in Microchannels,* Sep. 1989, Journal of Electronic Materials, vol. 18, No. 5, pp. 611–617.

Sanjay K. Roy et al., *A Very High Heat Flux Microchannel Heat Exchanger for Cooling of Semiconductor Laser Diode Arrays,* 1996, IEEE Transactions on components, packaging, and manufacturing technology–part B, vol. 19, No. 2, pp. 444–451.

Charlotte Gillot et al., *Integrated Single and Two–Phase Micro Heat Sinks Under IGBT Chips,* IEEE Transactions on Components and Packaging Technology, vol. 22 No. 3, Sep. 1999, pp. 384–389.

X.F. Peng et al., "Enhancing the Critical Flux Using Microchanneled Surfaces", Enhanced Heat Transfer, 1998, vol. 5 pp. 165–176.

Jae–Mo Koo et al., "Modeling of Two–Phase Microchannel Heat Sinks for VLSI Chips", Mech. Eng. Depart. of Stanford University, pp. 422–426.

Stephen C. Jacobson et al., "Fused Quartz Substrates for Microchip Electrophoresis", Analytical Chemistry, vol. 67, No. 13, Jul. 1, 1995, pp. 2059–2063.

Kendra V. Sharp et al., "Liquid Flows in Microchannels", The MEMS Handbook, vol. 6, 2002, pp. 6–1 to 6–38.

Shuchi Shoji et al., "Microflow devices and systems", J. Micromech. Microeng. 4 (1994), pp. 157–171, printed in the U.K.

Angela Rasmussen et al., "Fabrication Techniques to Realize CMOS–Compatible Microfluidic Microchannels", Journal of Microelectromechanical, vol. 10, No. 2, Jun. 2001, pp. 286–297.

J.H. Wang et al., "Thermal–Hydraulic Characteristic of Micro Heat Exchangers", DSC–vol. 32, ASME Micromechanical Sensors, Actuators, and Systems, 1991, pp. 331–339.

Gad Hetsroni et al., "Nonuniform Temperature Distribution in Electronic Devices Cooled by Flow in Parallel Microchannels", IEEE Transactions on Components and Packaging Technologies, vol. 24, No. 1, Mar. 2001, pp. 16–23.

X. F. Peng et al., "Heat Transfer Characteristics of Water Flowing Through Microchannels", Experimental Heat Transfer, vol. 7, No. 4, Oct.–Dec. 1994, pp. 265–283.

Linan Jiang et al., "Forced Convection Boiling in a Microchannel Heat Sink", Journal of Microelectromechanical Systems, vol. 10, No. 1, Mar. 2001, pp. 80–87.

Muhammed M. Rahman et al., "Experimental Measurements of Fluid Flow and Heat Transfer in Microchannel Cooling Passages in a Chip Substrate", EEP–vol. 4–2, ASME Advances in Electronic Packages, 1993, pp. 685–692.

X. F. Peng et al., "Forced Convection and Flow Boiling Heat Transfer for Liquid Flowing Through Microchannels", vol. 36, No. 14, 1993, Int. J. Heat Mass Transfer, pp. 3421–3427.

Lung–Jieh Yang et al., "A Micro Fluidic System of Micro Channels with On–Site Sensors by Silicon Bulk Micromaching", vol. 3877, Sep. 1999, Microfluidic Devices and Systems II, pp. 267–272.

G. Mohiuddin Mala et al., "Heat Transfer and Fluid Flow in Microchannels", vol. 40, No. 13, 1997, Int. J. Heat Mass transfer, pp. 3079–3088, printed in Great Britain.

J.M. Cuta et al., "Fabrication and Testing of Micro–Channel Heat Exchangers", SPIE Microlithography and Metrology in Micromaching, vol. 2640, 1995, pp. 152–164.

Linan Jiang et al., "A Micro–Channel Heat Sink with Integrated Temperature Sensors for Phase Transition Study", 1999, 12$^{th}$ International Conference on Micro ElectroMechanical Systems, pp. 159–164.

Linan Jiang et al., "Fabrication and Characterization of a Microsystem for a Micro–Scale Heat Transfer Study", J. Micromech. Microeng. 9 (1999), pp. 422–428, printed in the U.K.

M. B. Bowers et al., "High Flux Boiling in Low Flow Rate, Low Pressure Drop Mini–Channel and Micro–Channel Heat Sinks", vol. 37, No. 2, 1994, Int. J. Heat Mass Transfer, pp. 321–332.

Yongendra Joshi, "Heat Out of Small Packages", Dec. 2001, Mechanical Engineering, pp. 56–58.

A. Rostami et al., "Liquid Flow and Heat Transfer in Microchannels: a Review", vol. 18, No. 2, 2000, Heat and Technology, pp. 59–68.

Lian Zhang et al., "Measurements and Modeling of Two–Phase Flow in Microchannels with Nearly Constant Heat Flux Boundary Conditions", Journal of Microelectromechanical Systems, vol. 11, No. 1, Feb. 2002, pp. 12–19.

Muhammed Mustafizur Rahman, "Measurement of Heat Transfer in Microchannel Heat Sinks", Int. Comm. Heat Mass Transfer, vol. 27, No. 4, May 2000, pp. 495–506.

Issam Mudawar et al., "Enhancement of Critical Heat Flux from High Power Microelectronic Heat Sources in a Flow Channel", Journal of Electronic Packaging, vol. 112, Sep. 1990, pp. 241–248.

Nelson Kuan, "Experimental Evaluation of Micro Heat Exchangers Fabricated in Silicon", HTD–vol. 331, vol. 9, 1996, National Heat Transfer Conference, pp. 131–136.

E. W. Kreutz et al., "Simulation of Micro–Channel Heat Sinks for Optoelectronic Microsystems", Microelectronics Journal, vol. 31, 2000, pp. 787–790.

J. C. Y. Koh et al., "Heat Transfer of Microstructure for Integrated Circuits", vol. 13, 1986, Int. Comm. Heat Mass Transfer, pp. 89–98.

Snezana Konecni et al., "Convection Coding of Microelectronic Chips", 1992, InterSociety Conference on Thermal Phenomena, pp. 138–144.

Michael B. Kleiner et al., "High Performance Forced Air Cooling Scheme Employing Microchannel Heat Exchangers", Vol. 18, No. 4, 1995, IEEE Transactions on Components, Packaging, and Manufacturing Technology–Part A, pp. 795–804.

Jerry K. Keska Ph. D. et al., "An Experimental Study on an Enhanced Microchannel Heat Sink for Microelectronics Applications", EEP–vol. 26–2, vol. 2, Advances in Electronic Packaging, 1999, pp. 1235–1259.

Shung–Wen Kang et al., "The Performance Test and Analysis of Silicon–Based Microchannel Heat Sink", vol. 3795, Jul. 1999, Terahertz and Gigahertz Photonics, pp. 259–270.

Joseph C. Tramontana, "Semiconductor Laser Body Heat Sink", Xerox Disclosure Journal, vol. 10, No. 6, Nov./Dec. 1985, pp. 379–381.

Sarah Arulanandam et al., "Liquid Transport in Rectangular Microchannels by Electroosmotic Pumping", Colloids and Surfaces A: Physicochemical and Engineering Aspects 161 (2000), pp. 89–102.

Jeffrey D. Barner et al., "Thermal Ink Jet Print Head Carriage with Integral Liquid Cooling Capabilities", Xerox Disclosure Journal–vol. 21, No. 1, Jan./Feb. 1996, pp. 33–34.

"Autonomous displacement of a solution in a microchannel by another solution", Research Disclosure, Jun. 2001, pp. 1046–1047.

John M. Waldvogel, "Aluminum Silicon Carbide Phase Change Heat Spreader", Motorola, Jun. 1999, Technical Developments, pp. 226–230.

James P. Slupe et al., "An Idea for Maintaining a Stable Thermal Environment for Electronic Devices", Research Disclosure, Aug. 2001, p. 1312.

John M. Waldvogel, "A Heat Transfer Enhancement Method for Forced Convection Bonded–Fin Heatsinks", Motorola, Dec. 1997, Technical Development, pp. 158–159.

"Thin Heat Pipe for Cooling Components on Printed Circuit Boards", IBM Technical Disclosure Bulletin, vol. 34, No. 7B, Dec. 1991, pp. 321–322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", vol. 14, No. 5, Oct. 1971, IBM Technical Disclosure Bulletin, p. 1425.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water–Cooled Element", IBM Technical Bulletin, vol. 30, No. 5, Oct. 1987, pp. 345–347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39–40.

"Chip Cooling Device", IBM Technical Disclosure Bulletin, vol. 30, No. 9, Feb. 1988, pp. 435–436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378–3380.

N. P. Bailey et al., "Cooling Device for Controlled Rectifier", IBM Technical Disclosure Bulletin, vol. 21, No. 11, Apr. 1979, pp. 4609–4610.

W. J. Kleinfelder et al., "Liquid–Filled Bellows Heat Sink", IBM Technical Disclosure Bulletin, vol. 21, No. 10, Mar. 1979, pp. 4125–4126.

R. P. Chrisfield et al., "Distributed Power/Thermal Control", IBM Technical Disclosure Bulletin, vol. 22, No. 3, Aug. 1979, pp. 1131–1132.

A. J. Arnold et al., "Heat Sink Design for Cooling Modules in a Forced Air Environment", IBM Technical Disclosure Bulletin, vol. 22, No. 6, Nov. 1979, pp. 2297–2298.

A. J. Arnold et al., "Structure for the Removal of Heat from an Integrated Circuit Module", IBM Technical Disclosure Bulletin, vol. 22, No. 6, Nov. 1979, pp. 2294–2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass–Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat–Pipe Vapor Cooling Etched Silicon Structure", IBM Technical Disclosure Bulletin, vol. 25, No. 8, Jan. 1983, pp. 4118–4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 1, Jan. 1995, pp. 55–56.

"Self–Contained Active Heat Dissipation Device", IBM Technical Disclosure Bulletin vol. 39, No. 4, Apr. 1996, pp. 115–116.

C. J. Keller et al., "Jet Cooling Cup for Cooling Semiconductor Devices", IBM Technical Disclosure Bulletin, vol. 20, No. 9, Feb. 1978, pp. 3575–3576.

B. J. Ronkese, "Centerless Ceramic Package with Directly Connected Heat Sink", IBM Technical Disclosure Bulletin, vol. 20, No. 9, Feb. 1978, p. 3577–3578.

K. S. Sachar, "Liquid Jet Cooling of Integrated Circuit Chips", vol. 20, No. 9, Feb. 1978, pp. 3727–3728.

A. H. Johnson, "Device Cooling", IBM Technical Disclosure Bulletin, vol. 20, No. 10, Mar. 1978, pp. 3919–3920.

A. L. Pacuzzo et al., "Integrated Circuit Module Package Cooling Structure", IBM Technical Disclosure Bulletin, vol. 20, No. 10, Mar. 1978, pp. 3898–3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336–4337.

J. A. Dorler et al., "Temperature Triggerable Fluid Coupling System for Cooling Semiconductor Dies", IBM Technical Disclosure Bulletin, vol. 20, No. 11A, Apr. 1978, pp. 4386–4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334–4335.

A. J. Arnold, "Electronic Packaging Structure", IBM Technical Disclosure Bulletin, vol. 11B, Apr. 1978, pp. 4820–4822.

V. Y. Doo et al., "High Performance Package for Memory", IBM Technical Disclosure Bulletin, vol. 21, No. 2, Jul. 1978, pp. 585–586.

"Multi–Chip Package with Cooling by a Spreader Plate in Contact with a Chip Having Cylindrical Holes Mating with an Inverse Frame Providing Water Flow Within its Pins", IBM Technical Disclosure Bulletin, vol. 31, No. 5, Oct. 1988, pp. 141–142.

J. Landrock et al., "Cooling System for Semiconducting Chips," IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755–2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5–7.

"TCM–Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305–306.

"Water–Cooled Circuit Module with Grooves Forming Wave Passages Near Heat–Producing Devices", IBM Technical Disclosure Bulletin, vol. 31, No. 12, May 1989, pp. 49–50.

"Cold Plate for Thermal conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run–in Testing of Multi–Chip Modules", IBM Technical Disclosure Bulletin, vol. 32, No. 5A, Oct. 1989, p. 129–130.

"Means of Removing More Heat From a TCM (Or Other Liquid–Cooled Logic Package) By Reducing the Coolant Temperature", IBM Technical Disclosure Bulletin, vol. 32, No. 5A, Oct. 1989, pp. 153–154.

E. G. Loeffel et al.,"Liquid Cooled Module with Compliant Membrane", IBM Technical Disclosure Bulletin, vol. 20, No. 2, Jul. 1977, pp. 673–674.

V. Y. Doo et al., "Method of Effective Cooling of a High Power Silicon Chip", IBM Technical Disclosure Bulletin, vol. 20, No. 4, Sep. 1977, p. 1436–1437.

V. Y. Doo et al., Semiconductor Chip Cooling Package, IBM Technical Disclosure Bulletin, vol. 20, No. 4, Sep. 1977, pp. 1440–1441.

"Heat Sink Fabrication Method", IBM Technical Disclosure Bulletin, vol. 27, No. 10A, Mar. 1985, p. 5656–5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 9, Sep. 1994, p. 171.

H. Krumm, "Chip Cooling", IBM Technical Disclosure Bulletin, vol. 20, No. 7, Dec. 1977, p. 2728.

Youngcheol Joo et al., "Fabrication of Monolithic Microchannels for IC Chip Cooling", 1995, IEEE Micro Electro Mechanical Systems, pp. 362–367.

* cited by examiner

INTERWOVEN MANIFOLDS FOR PRESSURE DROP REDUCTION IN MICROCHANNEL HEAT EXCHANGERS

RELATED APPLICATIONS

This Patent Application claims priority under 35 U.S.C. 119(e) of the co-pending U.S. Provisional Patent Application, Ser. No. 60/423,009, filed Nov. 1, 2002 and entitled "METHODS FOR FLEXIBLE FLUID DELIVERY AND HOTSPOT COOLING BY MICROCHANNEL HEAT SINKS" which is hereby incorporated by reference. This Patent Application also claims priority under 35 U.S.C. 119(e) of the co-pending U.S. Provisional Patent Application, Ser. No. 60/442,383, filed Jan. 24, 2003 and entitled "OPTIMIZED PLATE FIN HEAT EXCHANGER FOR CPU COOLING" which is also hereby incorporated by reference. In addition, this Patent Application claims priority under 35 U.S.C. 119(e) of the co-pending U.S. Provisional Patent Application, Ser. No. 60/455,729, filed Mar. 17, 2003 and entitled "MICROCHANNEL HEAT EXCHANGER APPARATUS WITH POROUS CONFIGURATION AND METHOD OF MANUFACTURING THEREOF", which is hereby incorporated by reference.

FIELD OF THE INVENTION

The invention relates to a method and apparatus for cooling a heat producing device in general, and specifically, to an interwoven manifold for pressure drop reduction in a microchannel heat exchanger.

BACKGROUND OF THE INVENTION

Since their introduction in the early 1980s, microchannel heat sinks have shown much potential for high heat-flux cooling applications and have been used in the industry. However, existing microchannels include conventional parallel channel arrangements which are used are not well suited for cooling heat producing devices which have spatially-varying heat loads. Such heat producing devices have areas which produce more heat than others. These hotter areas are hereby designated as "hot spots" whereas the areas of the heat source which do not produce as much heat are hereby termed, "warm spots".

FIG. 1A illustrates a prior art heat exchanger 10 which is coupled to an electronic device 99, such as a microprocessor via a thermal interface material 98. As shown in FIG. 1A, fluid generally flows from a single inlet port 12 and flows along the bottom surface 11 in between the parallel microchannels 14, as shown by the arrows, and exits through the outlet port 16. Although the heat exchanger 10 cools the electronic device 99, the fluid flows from the inlet port 12 to the outlet port 16 in a uniform manner. In other words, the fluid flows substantially uniformly along the entire bottom surface 11 of the heat exchanger 10 and does not supply more fluid to areas in the bottom surface 11 which correspond with hot spots in the device 99. In addition, the temperature of liquid flowing from the inlet generally increases as it flows along the bottom surface 11 of the heat exchanger. Therefore, regions of the heat source 99 which are downstream or near the outlet port 16 are not supplied with cool fluid, but actually fluid which has already been heated upstream. In effect, the heated fluid actually propagates the heat across the entire bottom surface 11 of the heat exchanger and region of the heat source 99, whereby fluid near the outlet port 16 is so hot that it becomes ineffective in cooling heat source. In addition, the heat exchanger 10 having only one inlet 12 and one outlet 16 forces fluid to travel along the long parallel microchannels 14 in the bottom surface 11 for the entire length of the heat exchanger 10, thereby creating a large pressure drop.

FIG. 1B illustrates a side view diagram of a prior art multi-level heat exchanger 20. Fluid enters the multi-level heat exchanger 20 through the port 22 and travels downward through multiple jets 28 in the middle layer 26 to the bottom surface 27 and out port 24. In addition, the fluid traveling along the jets 28 may or may not uniformly flow down to the bottom surface 27. Nonetheless, although the fluid entering the heat exchanger 20 is spread over the length of the heat exchanger 20, the design does not provide more fluid to the hotter areas of the heat exchanger 20 and heat source that are in need of more fluid flow circulation.

In addition, conventional heat exchangers are made of materials which have high thermal resistance in the bottom surface, such that the heat exchanger has a coefficient of thermal expansion which matches that of the heat source 99. The high thermal resistance of the heat exchanger thereby does not allow sufficient heat exchange with the heat source 99. To account for the high thermal resistance, larger channel cross-sectional areas are chosen such that more thermal exchange occurs between the heat exchanger 10 and the heat source 99. In addition, the dimensions of the channels in the heat exchanger are scaled down and the distance between the channel walls and the hydraulic diameter is made smaller, the thermal resistance of the heat exchanger is reduced. However, a problem with using narrow microchannels is the increase in pressure drop along the channels. The increase in pressure drop places extreme demands on a pump driving the fluid through the heat exchanger. In addition, larger microchannel dimensions also cause a larger pressure drop between the inlet and outlet ports, due to the long distance that one or two phase fluid must travel. Further, boiling of the fluid in a microchannel heat exchanger causes a larger pressure drop for a given flowrate due to the mixing of fluid and vapor as well as the acceleration of the fluid into the vapor phase. Both of these factors increase the pressure drop per unit length. The large pressure drop created within the current microchannel heat exchangers require larger pumps which can handle higher pressures and thereby are not feasible in a microchannel setting.

What is needed is a microchannel heat exchanger which is configured to achieve proper temperature uniformity in the heat source. What is also needed is a heat exchanger which is configured to achieve proper uniformity in light of hot spots in the heat source. What is also needed is a heat exchanger having a relatively high thermal conductivity to adequately perform thermal exchange with the heat source. What is further needed is a heat exchanger which is configured to achieve a small pressure drop between the inlet and outlet fluid ports.

SUMMARY OF THE INVENTION

In one aspect of the invention, a microchannel heat exchanger comprises an interface layer for cooling a heat source. The interface layer is configured to pass fluid therethrough and is coupled to the heat source. The heat exchanger also comprises a manifold layer which has a first set fingers and a second set of fingers. The first set of fingers provide fluid to the interface layer at a first set of predetermined locations and the second set of fingers remove fluid from the interface layer at a second set of predetermined locations. A particular finger in the first set is spaced apart by an appropriate dimension from a particular finger in the second set to minimize pressure drop in the heat exchanger and configured in an interwoven array. The heat exchanger further comprises at least one first port in communication with the first set of fingers, wherein fluid enters the heat exchanger through the at least one first port. The heat exchanger also further comprises at least one second port in communication with the second set of fingers, wherein fluid exits the heat exchanger through the at least one second port. Preferably, the manifold layer is positioned above the interface layer, wherein fluid flows downward through the first set of fingers to the interface layer. Preferably, the fingers in the first set are positioned in an alternating configuration with the fingers in the second set. It is preferred that the fingers are parallel and have a constant dimension. Alternatively, the fingers are not parallel and have varying dimensions. The heat exchanger further comprises a first port passage in communication with the first port and the first set of fingers. The first port passage is configured to channel fluid from the first port to the first set of fingers to minimize pressure drop within the heat exchanger. The heat exchanger further comprises a second port passage in communication with the second port and the second set of fingers. The second port passage is configured to channel fluid from the second set of fingers to the second port to minimize pressure drop within the heat exchanger. The heat exchanger further comprises an intermediate layer which optimally channels fluid from the manifold layer to the interface layer in at least one predetermined interface hot spot regions. The intermediate layer is coupled to the interface layer and the manifold layer and, alternatively, integrally formed with the interface layer and the manifold layer. The interface layer has a thermal conductivity of at least 20 W/m-K and preferably at least 100 W/m-K. Alternatively, the interface layer includes a coating thereupon, wherein the coating provides an appropriate thermal conductivity of at least 20 W/m-K. Preferably, the interface layer further comprises a plurality of microchannels configured in a predetermined pattern. The plurality of microchannels are coupled to the interface layer and alternatively integrally formed with the interface layer. The interface layer further comprises at least one groove that is disposed adjacently to the plurality of microchannels which is aligned with the finger in the first and second sets. The thermal conductivity of the coating is at least 20 W/m-K and alternatively has a coating thereupon, wherein the coating has an appropriate thermal conductivity. The interface layer alternatively further comprises a plurality of pillars configured in a predetermined pattern along the interface layer. Alternatively, the interface layer has a roughened surface. The interface layer alternatively includes a micro-porous configuration.

In another aspect of the invention, a heat exchanger for cooling a heat source comprises a manifold layer which includes a first set of fingers in a first configuration. Each finger in the first set channels fluid at a first temperature. The manifold layer further includes a second set of fingers in a second configuration, wherein each finger in the second set channels fluid at a second temperature. The first and second sets of fingers are arranged in an interwoven pattern. The heat exchanger also comprises an interface layer that is coupled to the heat source and is configured to receive fluid at the first temperature at a plurality of first locations. Each first location is associated with a corresponding finger in the first set, whereby the interface layer passes fluid along a plurality of predetermined paths to a plurality of second locations. Each second location is associated with a corresponding finger in the second set. A particular finger in the first set is spaced apart by an appropriate dimension from a particular finger in the second set, wherein the appropriate dimension provides a minimal pressure drop in the heat exchanger. It is preferred that the fingers are parallel and have a constant dimension. Alternatively, the fingers are not parallel and have varying dimensions. The heat exchanger further comprises at least one first port that is in communication with the first set of fingers, whereby fluid enters the heat exchanger through the at least one first port. The heat exchanger further comprises at least one second port in communication with the second set of fingers, whereby fluid exits the heat exchanger through the at least one second port. The manifold layer is preferably positioned above the interface layer, wherein fluid flows downward through the first set of fingers to the interface layer. Preferably, the fingers in the first set are positioned in an alternating configuration with the fingers in the second set. The heat exchanger further comprises a first port passage that is in communication with the first port and the first set of fingers. The first port passage is configured to channel fluid from the first port to the first set of fingers to minimize pressure drop within the heat exchanger. The heat exchanger further comprises a second port passage that is in communication with the second port and the second set of fingers. The second port passage is configured to channel fluid from the second set of fingers to the second port to minimize pressure drop within the heat exchanger. The heat exchanger further comprises an intermediate layer which optimally channels fluid from the manifold layer to the interface layer at least one predetermined interface hot spot regions. The intermediate layer is positioned between the interface layer and the manifold layer, wherein the intermediate layer optimally channels fluid to at least one predetermined interface hot spot regions in the interface layer. The intermediate layer is coupled to the interface layer and the manifold layer and, alternatively, is integrally formed with the interface layer and the manifold layer. The interface layer has a thermal conductivity of at least 20 W/m-K and alternatively includes a coating thereupon, wherein the coating provides an appropriate thermal conductivity of at least 20 W/m-K and preferably at least 100 W/m-K. Preferably, the interface layer further comprises a plurality of microchannels configured in a predetermined pattern. The plurality of microchannels are coupled to the interface layer and, alternatively, integrally formed with the interface layer. The interface layer further comprises at least one groove that is disposed adjacently to the plurality of microchannels which is aligned with the finger in the first set. The thermal conductivity of the coating is at least 20 W/m-K and alternatively has a coating thereupon, wherein the coating has an appropriate thermal conductivity. The interface layer alternatively further comprises a plurality of pillars configured in a predetermined pattern along the interface layer. Alternatively, the interface layer has a roughened surface. The interface layer alternatively includes a micro-porous configuration.

In yet another aspect of the invention, a microchannel heat exchanger is coupled to a heat source and configured to cool the heat source. The microchannel heat exchanger comprises a first set of fingers which provide fluid at a first temperature to a heat exchange region. The fluid in the heat exchange region flows toward a second set of fingers and exits the heat exchanger at a second temperature. Each finger is spaced apart from an adjacent finger by an appropriate dimension to minimize pressure drop in the heat exchanger and arranged in an interwoven or inter-digitated pattern. The microchannel heat exchanger further comprises an interface layer which has a heat exchange region, wherein the fluid undergoes thermal exchange with the heat source along the heat exchange region. Alternatively, the interface layer further comprises the first set of fingers and the second set of fingers which are configured along the heat exchange region. Preferably, the microchannel heat exchanger further comprises a manifold layer for providing fluid to the interface layer, wherein the manifold layer includes the first set of fingers and the second set of fingers configured within. The heat exchanger further comprises at least one first port that is in communication with the first set of fingers, whereby fluid enters the heat exchanger through the at least one first port. The heat exchanger further comprises at least one second port in communication with the second set of fingers, whereby fluid exits the heat exchanger through the at least one second port. The manifold layer is preferably positioned above the interface layer, wherein fluid flows downward through the first set of fingers to the interface layer. Preferably, the fingers in the first set are positioned in an alternating configuration with the fingers in the second set. The heat exchanger further comprises a first port passage that is in communication with the first port and the first set of fingers. The first port passage is configured to channel fluid from the first port to the first set of fingers to minimize pressure drop within the heat exchanger. The heat exchanger further comprises a second port passage that is in communication with the second port and the second set of fingers. The second port passage is configured to channel fluid from the second set of fingers to the second port to minimize pressure drop within the heat exchanger. The heat exchanger further comprises an intermediate layer which optimally channels fluid from the manifold layer to the interface layer at least one predetermined interface hot spot regions. The intermediate layer is positioned between the interface layer and the manifold layer, wherein the intermediate layer optimally channels fluid to at least one predetermined interface hot spot regions in the interface layer. The intermediate layer is coupled to the interface layer and the manifold layer and, alternatively, is integrally formed with the interface layer and the manifold layer. The interface layer has a thermal conductivity of at least 20 W/m-K and alternatively includes a coating thereupon, wherein the coating provides an appropriate thermal conductivity of at least 20 W/m-K. Preferably, the interface layer further comprises a plurality of microchannels configured in a predetermined pattern. The plurality of microchannels are coupled to the interface layer and, alternatively, integrally formed with the interface layer. The interface layer further comprises at least one groove that is disposed adjacently to the plurality of microchannels which is aligned with the finger in the first set. The thermal conductivity of the coating is at least 20 W/m-K and alternatively has a coating thereupon, wherein the coating has an appropriate thermal conductivity. The interface layer alternatively further comprises a plurality of pillars configured in a predetermined pattern along the interface layer. Alternatively, the interface layer has a roughened surface. The interface layer alternatively includes a micro-porous configuration.

In yet another aspect of the invention, a method of cooling a heat source comprises providing fluid at a first temperature to a heat exchange region via a first set of fingers in a first configuration. The method also comprises channeling the fluid along a plurality of predetermined paths along the heat exchange region, wherein the fluid is channeled to a second set of fingers in a second configuration. The fingers in each set are configured to minimize pressure drop and in an inter-digitated or interwoven array. The method also comprises removing fluid at a second temperature from the heat exchange region via the second set of fingers. Preferably, the first set and second set of fingers are disposed above the heat exchange region. Alternatively, the first set and second set of fingers are disposed along the heat exchange region.

Other features and advantages of the present invention will become apparent after reviewing the detailed description of the preferred embodiments set forth below.

DETAILED DESCRIPTION OF THE PRESENT INVENTION

Generally, the heat exchanger captures thermal energy generated from a heat source by passing fluid through selective areas of the interface layer which is preferably coupled to the heat source. In particular, the fluid is directed to specific areas in the interface layer to cool the hot spots and areas around the hot spots to generally create temperature uniformity across the heat source while maintaining a small pressure drop within the heat exchanger. As discussed in the different embodiments below, the heat exchanger utilizes a plurality of apertures, channels and/or fingers in the manifold layer as well as conduits in the intermediate layer to direct and circulate fluid to and from selected hot spot areas in the interface layer. Alternatively, the heat exchanger includes several ports which are specifically disposed in predetermined locations to directly deliver fluid to and remove fluid from the hot spots to effectively cool the heat source.

It is apparent to one skilled in the art that although the microchannel heat exchanger of the present invention is described and discussed in relation to flexible fluid delivery for cooling hot spot locations in a device, the heat exchanger is alternatively used for flexible fluid delivery for heating a cold spot location in a device. It should also be noted that although the present invention is preferably described as a microchannel heat exchanger, the present invention can be used in other applications and is not limited to the discussion herein.

Figure 2A:
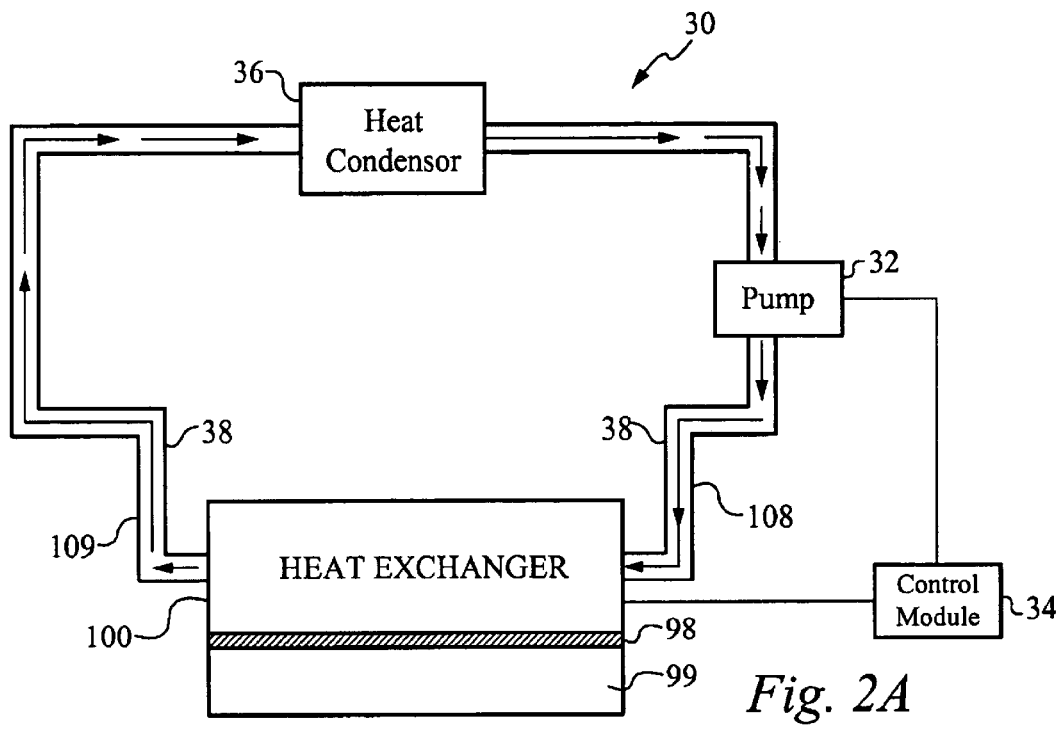
FIG. 2A illustrates a schematic diagram of a closed loop cooling system incorporating a preferred embodiment of the flexible fluid delivery microchannel heat exchanger of the present invention.
Figure 2B:
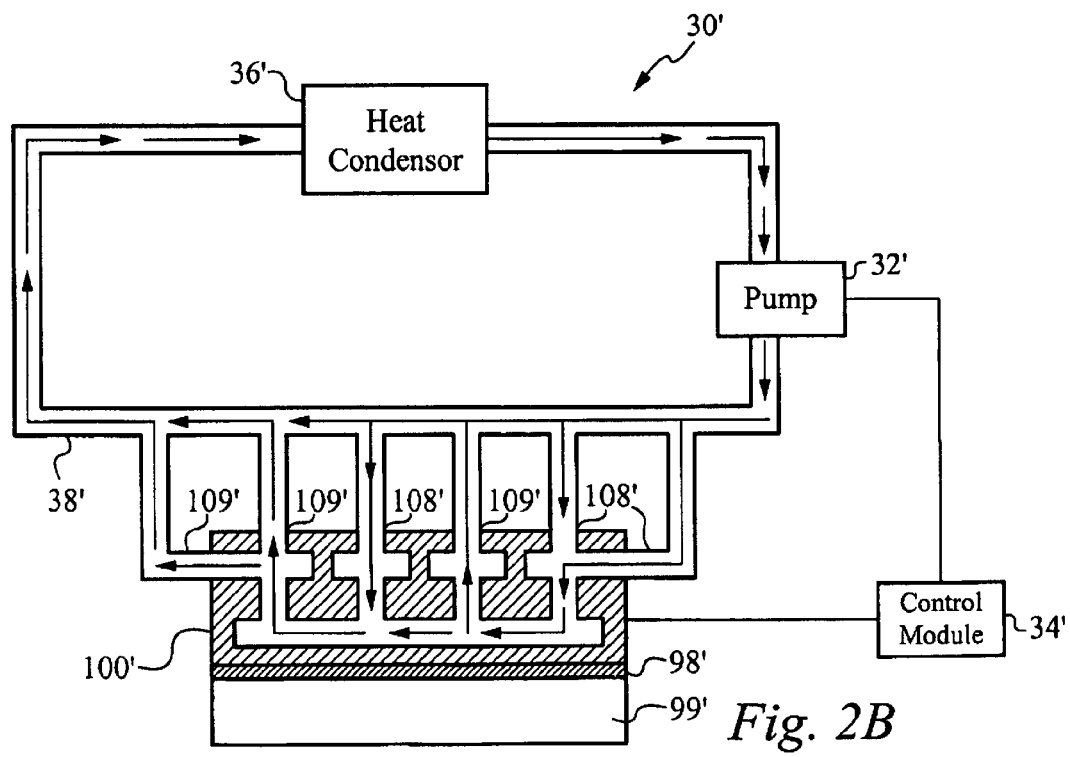
FIG. 2B illustrates a schematic diagram of a closed loop cooling system incorporating an alternative embodiment of the flexible fluid delivery microchannel heat exchanger of the present invention.

FIG. 2A illustrates a schematic diagram of a closed loop cooling system 30 which includes a preferred flexible fluid delivery microchannel heat exchanger 400 in accordance with the present invention. In addition, FIG. 2B illustrates a schematic diagram of a closed loop cooling system 30 which includes an alternative flexible fluid delivery microchannel heat exchanger 200 with multiple ports 108, 109 in accordance with the present invention.

As shown in FIG. 2A, the fluid ports 108, 109 are coupled to fluid lines 38 which are coupled to a pump 32 and heat condensor 30. The pump 32 pumps and circulates fluid within the closed loop 30. It is preferred that one fluid port 108 is used to supply fluid to the heat exchanger 100. In addition, it is preferred that one fluid port 109 is used to remove fluid from the heat exchanger 100. Preferably a uniform, constant amount of fluid flow enters and exits the heat exchanger 100 via the respective fluid ports 108, 109. Alternatively, different amounts of fluid flow enter and exit through the inlet and outlet port(s) 108, 109 at a given time. Alternatively, as shown in FIG. 2B, one pump provides fluid to several designated inlet ports 108. Alternatively, multiple pumps (not shown), provide fluid to their respective inlet and outlet ports 108, 109. In addition, the dynamic sensing and control module 34 is alternatively employed in the system to variate and dynamically control the amount and flow rate of fluid entering and exiting the preferred or alternative heat exchanger in response to varying hot spots or changes in the amount of heat in a hot spot location as well as the locations of the hot spots.

The preferred embodiment is a three level heat exchanger 400 which includes an interface layer 402, at least one intermediate layer 404 and at least one manifold layer 406. The preferred manifold layer 402 and the preferred interface layer 402 are shown in FIG. 7 and the intermediate layer 104 is shown in FIG. 3B. Alternatively, as discussed below, the heat exchanger 400 is a two level apparatus which includes the interface layer 402 and the manifold layer 406, as shown in FIG. 7. As shown in FIGS. 2A and 2B, the heat exchanger 400 is coupled to a heat source 99, such as an electronic device, including, but not limited to a microchip and integrated circuit, whereby a thermal interface material 98 is preferably disposed between the heat source 99 and the heat exchanger 100. Alternatively, the heat exchanger 400 is directly coupled to the surface of the heat source 99. It is also apparent to one skilled in the art that the heat exchanger 400 is alternatively integrally formed into the heat source 99, whereby the heat exchanger 400 and the heat source 99 are formed as one piece. Thus, the interface layer 102 is integrally disposed with the heat source 99 and is formed as one piece with the heat source.

It is preferred that the heat exchanger 400 of the present invention is configured to be directly or indirectly in contact with the heat source 99 which is rectangular in shape, as shown in the figures. However, it is apparent to one skilled in the art that the heat exchanger 400 can have any other shape conforming with the shape of the heat source 99. For example, the heat exchanger of the present invention can be configured to have an outer semicircular shape which allows the heat exchanger (not shown) to be in direct or indirect contact with a corresponding semicircular shaped heat source (not shown). In addition, it is preferred that the heat exchanger 400 is slightly larger in dimension than the heat source within the range of and including 0.5–5.0 millimeters.

Figure 3A:
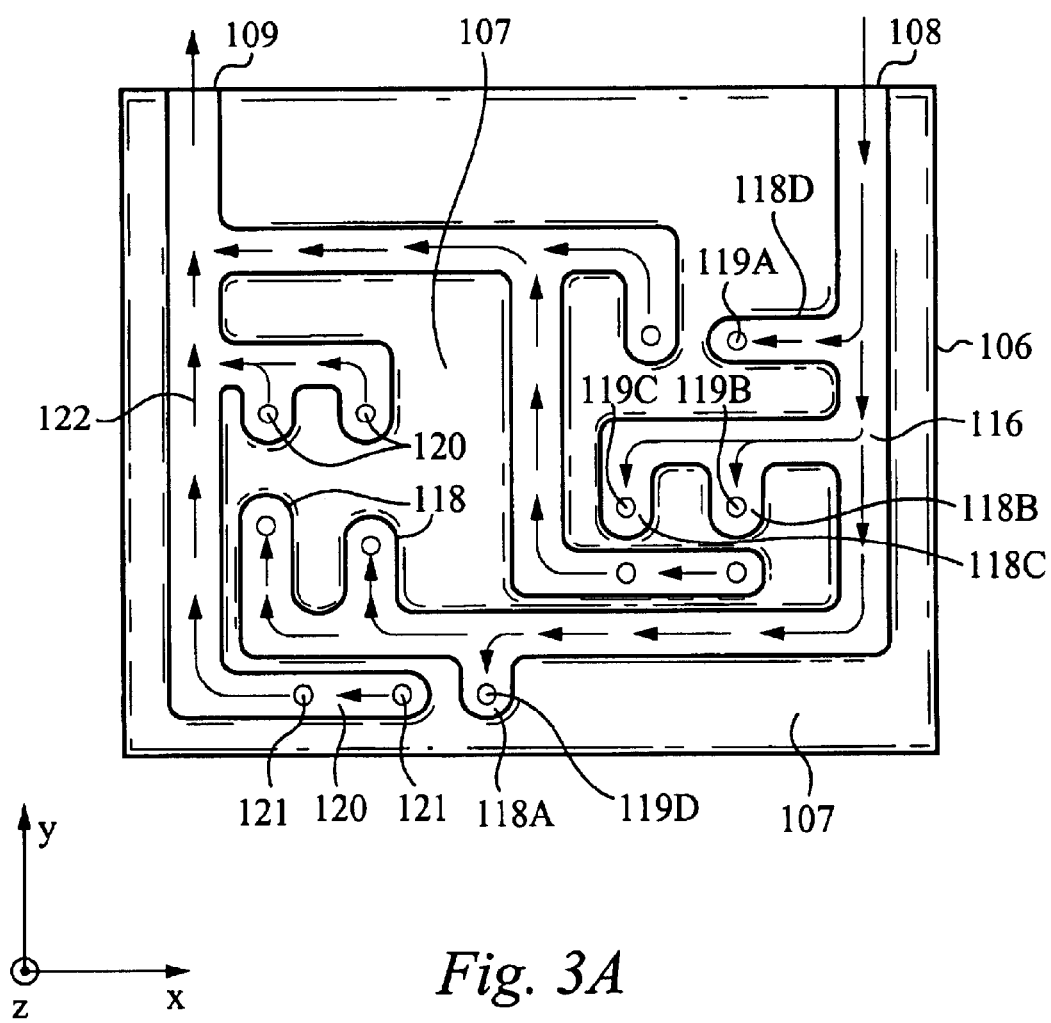
FIG. 3A illustrates a top view of an alternative manifold layer of the heat exchanger in accordance with the present invention.
Figure 3B:
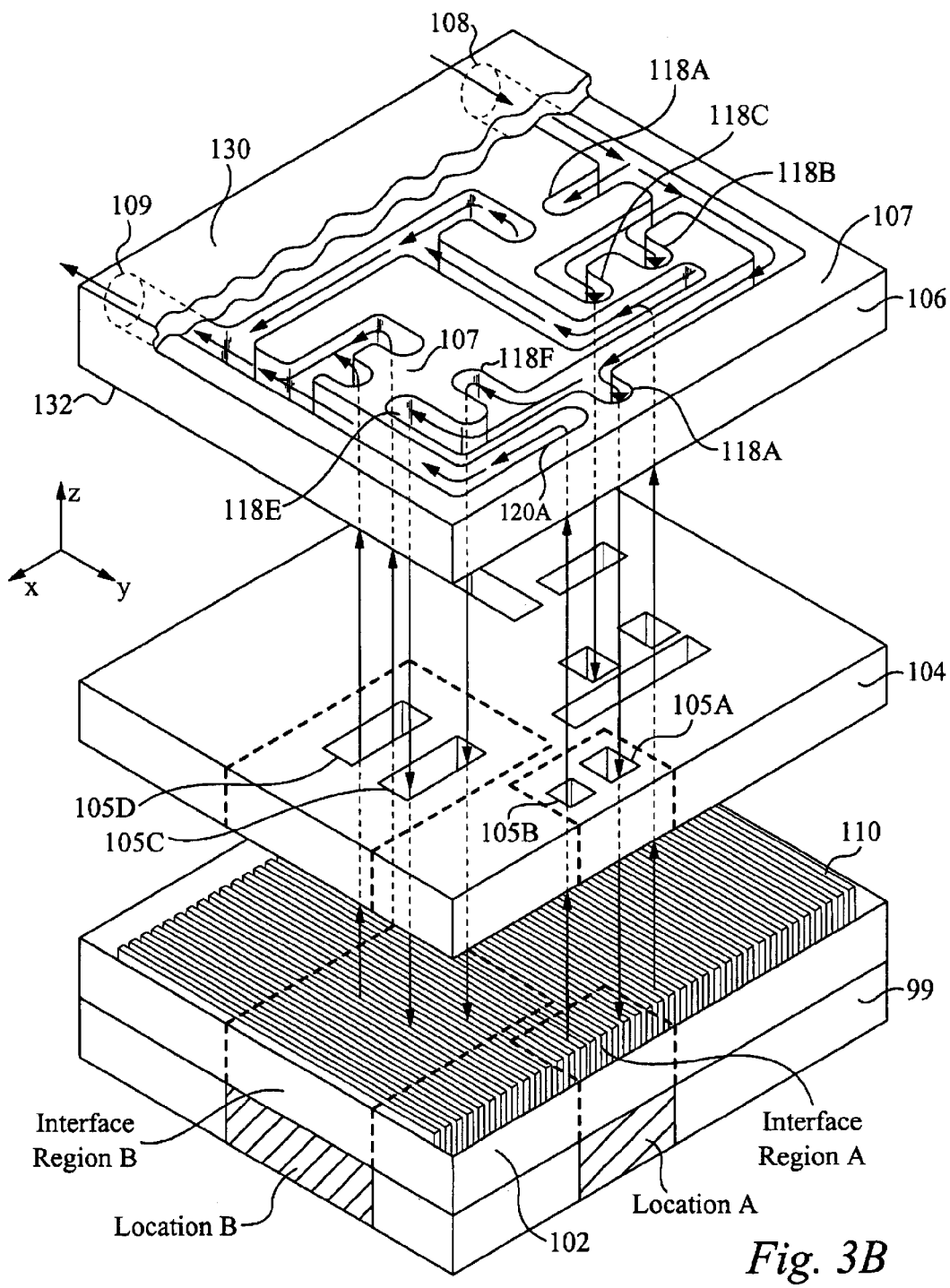
FIG. 3B illustrates an exploded view of an alternative heat exchanger with the alternative manifold layer in accordance with the present invention.

FIG. 3A illustrates a top view of the alternate manifold layer 106 of the present invention. In particular, as shown in FIG. 3B, the manifold layer 106 includes four sides as well as a top surface 130 and a bottom surface 132. However, the top surface 130 is removed in FIG. 3A to adequately illustrate and describe the workings of the manifold layer 106. As shown in FIG. 3A, the manifold layer 106 has a series of channels or passages 116, 118, 120, 122 as well as ports 108, 109 formed therein. The fingers 118, 120 extend completely through the body of the manifold layer 106 in the Z-direction as shown in FIG. 3B. Alternatively, the fingers 118 and 120 extend partially through the manifold layer 106 in the Z-direction and have apertures as shown in FIG. 3A. In addition, passages 116 and 122 extend partially through the manifold layer 106. The remaining areas between the inlet and outlet passages 116, 120, designated as 107, extend from the top surface 130 to the bottom surface 132 and form the body of the manifold layer 106.

As shown in FIG. 3A, the fluid enters manifold layer 106 via the inlet port 108 and flows along the inlet channel 116 to several fingers 118 which branch out from the channel 116 in several directions in the X and/or Y directions to apply fluid to selected regions in the interface layer 102. The fingers 118 are arranged in different predetermined directions to deliver fluid to the locations in the interface layer 102 corresponding to the areas at or near the hot spots in the heat source. These locations in the interface layer 102 are hereinafter referred to as interface hot spot regions. The fingers are configured to cool stationary as well as temporally varying interface hot spot regions. As shown in FIG. 3A, the channels 116, 122 and fingers 118, 120 are disposed in the X and/or Y directions in the manifold layer 106. Thus, the various directions of the channels 116, 122 and fingers 118, 120 allow delivery of fluid to cool hot spots in the heat source 99 and/or minimize pressure drop within the heat exchanger 100. Alternatively, channels 116, 122 and fingers 118, 120 are periodically disposed in the manifold layer 106 and exhibit a pattern, as in the preferred embodiment.

The arrangement as well as the dimensions of the fingers 118, 120 are determined in light of the hot spots in the heat source 99 that are desired to be cooled. The locations of the hot spots as well as the amount of heat produced near or at each hot spot are used to configure the manifold layer 106 such that the fingers 118, 120 are placed above or proximal to the interface hot spot regions in the interface layer 102. The manifold layer 106 preferably allows one phase and/or two-phase fluid to circulate to the interface layer 102 without allowing a substantial pressure drop from occurring within the heat exchanger 100 and the system 30 (FIG. 2A). The fluid delivery to the interface hot spot regions creates a uniform temperature at the interface hot spot region as well as areas in the heat source adjacent to the interface hot spot regions.

The dimensions as well as the number of channels 116 and fingers 118 depend on a number of factors. In one embodiment, the inlet and outlet fingers 118, 120 have the same width dimensions. Alternatively, the inlet and outlet fingers 118, 120 have different width dimensions. The width dimensions of the fingers 118, 120 are preferably within the range of and including 0.25–0.50 millimeters. In one embodiment, the inlet and outlet fingers 118, 120 have the same length and depth dimensions. Alternatively, the inlet and outlet fingers 118, 120 have different length and depth dimensions. In another embodiment, the inlet and outlet fingers 118, 120 have varying width dimensions along the length of the fingers. The length dimensions of the inlet and outlet fingers 118, 120 are within the range of and including 0.5 millimeters to three times the size of the heat source length. In addition, the fingers 118, 120 have a height or depth dimension within the range and including 0.25–0.50 millimeters. In addition, less than 10 or more than 30 fingers per centimeter are disposed in the manifold layer 106. However, it is apparent to one skilled in the art that between 10 and 30 fingers per centimeter in the manifold layer is alternatively contemplated.

It is contemplated within the present invention to tailor the geometries of the fingers 118, 120 and channels 116, 122 to be in non-periodic arrangement to aid in optimizing hot spot cooling of the heat source. In order to achieve a uniform temperature across the heat source 99, the spatial distribution of the heat transfer to the fluid is matched with the spatial distribution of the heat generation. As the fluid flows along the interface layer through the microchannels 110, its temperature increases and as it begins to transform to vapor under two-phase conditions. Thus, the fluid undergoes a significant expansion which results in a large increase in velocity. Generally, the efficiency of the heat transfer from the interface layer to the fluid is improved for high velocity flow. Therefore, it is possible to tailor the efficiency of the heat transfer to the fluid by adjusting the cross-sectional dimensions of the fluid delivery and removal fingers 118, 120 and channels 116, 122 in the heat exchanger 100.

For example, a particular finger can be designed for a heat source where there is higher heat generation near the inlet. In addition, it may be advantageous to design a larger cross section for the regions of the fingers 118, 120 and channels 116, 122 where a mixture of fluid and vapor is expected. Although not shown, a finger can be designed to start out with a small cross sectional area at the inlet to cause high velocity flow of fluid. The particular finger or channel can also be configured to expand to a larger cross-section at a downstream outlet to cause a lower velocity flow. This design of the finger or channel allows the heat exchanger to minimize pressure drop and optimize hot spot cooling in areas where the fluid increases in volume, acceleration and velocity due to transformation from liquid to vapor in two-phase flow.

In addition, the fingers 118, 120 and channels 116, 122 can be designed to widen and then narrow again along their length to increase the velocity of the fluid at different places in the microchannel heat exchanger 100. Alternatively, it may be appropriate to vary the finger and channel dimensions from large to small and back again many times over in order to tailor the heat transfer efficiency to the expected heat dissipation distribution across the heat source 99. It should be noted that the above discussion of the varying dimensions of the fingers and channels also apply to the other embodiments discussed and is not limited to this embodiment.

Alternatively, as shown in FIG. 3A, the manifold layer 106 includes one or more apertures 119 in the inlet fingers 118. In the three tier heat exchanger 100, the fluid flowing along the fingers 118 flows down the apertures 119 to the intermediate layer 104. Alternatively, in the two-tier heat exchanger 100, the fluid flowing along the fingers 118 flows down the apertures 119 directly to the interface layer 102. In addition, as shown in FIG. 3A, the manifold layer 106 includes apertures 121 in the outlet fingers 120. In the three tier heat exchanger 100, the fluid flowing from the intermediate layer 104 flows up the apertures 121 into the outlet fingers 120. Alternatively, in the two-tier heat exchanger 100, the fluid flowing from the interface layer 102 flows directly up the apertures 121 into the outlet fingers 120.

In the embodiment shown in FIG. 3A, the inlet and outlet fingers 118, 120 are open channels which do not have apertures. The bottom surface 103 of the manifold layer 106 abuts against the top surface of the intermediate layer 104 in the three tier exchanger 100 or abuts against the interface layer 102 in the two tier exchanger. Thus, in the three-tier heat exchanger 100, fluid flows freely to and from the intermediate layer 104 and the manifold layer 106. The fluid is directed to and from the appropriate interface hot spot region by conduits 105 in the intermediate layer 104. It is apparent to one skilled in the art that the conduits 105 are directly aligned with the fingers, as described below or positioned elsewhere in the three tier system.

FIG. 3B illustrates an exploded view of the three tier heat exchanger 100 with the alternate manifold layer in accordance with the present invention. Alternatively, the heat exchanger 100 is a two layer structure which includes the manifold layer 106 and the interface layer 102, whereby fluid passes directly between the manifold layer 106 and interface layer 102 without passing through the intermediate layer 104. It is apparent to one skilled in the art that the configuration of the manifold, intermediate and interface layers are shown for exemplary purposes and is thereby not limited to the configuration shown.

As shown in FIG. 3B, the intermediate layer 104 includes a plurality of conduits 105 which extend therethrough. The inflow conduits 105 direct fluid entering from the manifold layer 106 to the designated interface hot spot regions in the interface layer 102. Similarly, the apertures 105 also channel fluid flow from the interface layer 102 to the exit fluid port(s) 109. Thus, the intermediate layer 104 also provides fluid delivery from the interface layer 102 to the exit fluid port 109 where the exit fluid port 108 is in communication with the manifold layer 106.

The conduits 105 are positioned in the interface layer 104 in a predetermined pattern based on a number of factors including, but not limited to, the locations of the interface hot spot regions, the amount of fluid flow needed in the interface hot spot region to adequately cool the heat source 99 and the temperature of the fluid. The conduits have a width dimension of 100 microns, although other width dimensions are contemplated up to several millimeters. In addition, the conduits 105 have other dimensions dependent on at least the above mentioned factors. It is apparent to one skilled in the art that each conduit 105 in the intermediate layer 104 has a same shape and/or dimension, although it is not necessary. For instance, like the fingers described above, the conduits alternatively have a varying length and/or width dimension. Additionally, the conduits 105 may have a constant depth or height dimension through the intermediate layer 104. Alternatively, the conduits 105 have a varying depth dimension, such as a trapezoidal or a nozzle-shape, through the intermediate layer 104. Although the horizontal shape of the conduits 105 are shown to be rectangular in FIG. 2C, the conduits 105 alternatively have any other shape including, but not limited to, circular (FIG. 3A), curved and elliptical. Alternatively, one or more of the conduits 105 are shaped and contour with a portion of or all of the finger or fingers above.

The intermediate layer 104 is horizontally positioned within the heat exchanger 100 with the conduits 105 positioned vertically. Alternatively, the intermediate layer 104 is positioned in any other direction within the heat exchanger 100 including, but not limited to, diagonal and curved forms. Alternatively, the conduits 105 are positioned within the intermediate layer 104 in a horizontally, diagonally, curved or any other direction. In addition, the intermediate layer 104 extends horizontally along the entire length of the heat exchanger 100, whereby the intermediate layer 104 completely separates the interface layer 102 from the manifold layer 106 to force the fluid to be channeled through the conduits 105. Alternatively, a portion of the heat exchanger 100 does not include the intermediate layer 104 between the manifold layer 106 and the interface layer 102, whereby fluid is free to flow therebetween. Further, the intermediate layer 104 alternatively extends vertically between the manifold layer 106 and the interface layer 102 to form separate, distinct intermediate layer regions. Alternatively, the intermediate layer 104 does not fully extend from the manifold layer 106 to interface layer 102.

FIG. 3B illustrates a perspective view of the interface layer 102 in accordance with the present invention. As shown in FIG. 3B, the interface layer 102 includes a bottom surface 103 and a plurality of microchannel walls 110, whereby the area in between the microchannel walls 110 channels or directs fluid along a fluid flow path. The bottom surface 103 is flat and has a high thermal conductivity to allow sufficient heat transfer from the heat source 99. Alternatively, the bottom surface 103 includes troughs and/or crests designed to collect or repel fluid from a particular location. The microchannel walls 110 are configured in a parallel configuration, as shown in FIG. 3B, whereby fluid preferably flows between the microchannel walls 110 along a fluid path. Alternatively, the microchannel walls 110 have non-parallel configurations.

Figure 10:
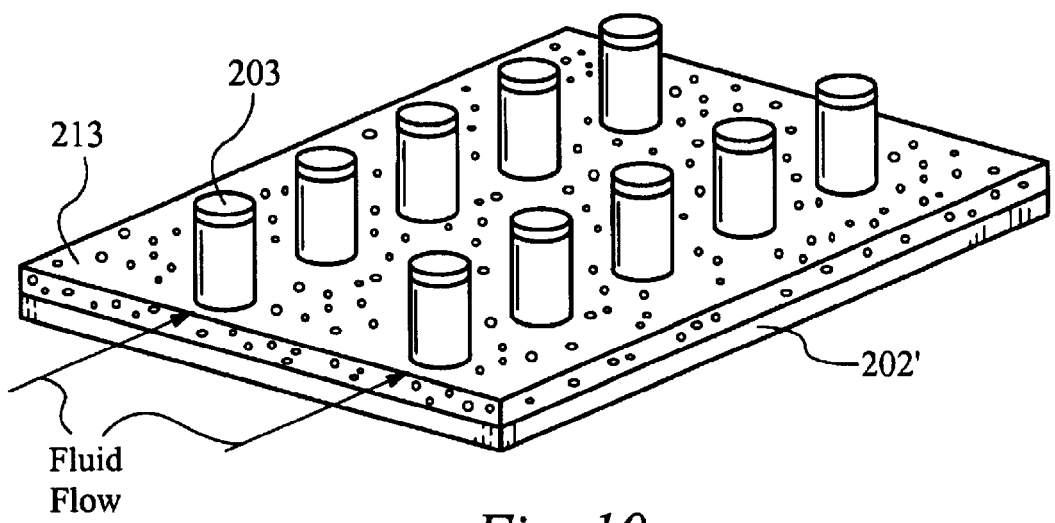
FIG. 10 illustrates a perspective view of the interface layer having a micro-pin array in accordance with the present invention.

It is apparent to one skilled in the art that the microchannel walls 110 are alternatively configured in any other appropriate configuration depending on the factors discussed above. For instance, the interface layer 102 alternatively has grooves in between sections of microchannel walls 110, as shown in FIG. 8C. In addition, the microchannel walls 110 have dimensions which minimize the pressure drop or differential within the interface layer 102. It is also apparent that any other features, besides microchannel walls 110 are also contemplated, including, but not limited to, pillars (FIG. 10), roughed surfaces, and a micro-porous structure, such as sintered metal and silicon foam (FIG. 10). However, for exemplary purposes, the parallel microchannel walls 110 shown in FIG. 3B is used to describe the interface layer 102 in the present invention.

The microchannel walls 110 allow the fluid to undergo thermal exchange along the selected hot spot locations of the interface hot spot region to cool the heat source 99 in that location. The microchannel walls 110 have a width dimension within the range of 20–300 microns and a height dimension within the range of 100 microns to one millimeter, depending on the power of the heat source 99. The microchannel walls 110 have a length dimension which ranges between 100 microns and several centimeters, depending on the dimensions of the heat source, as well as the size of the hot spots and the heat flux density from the heat source. Alternatively, any other microchannel wall dimensions are contemplated. The microchannel walls 110 are spaced apart by a separation dimension range of 50–500 microns, depending on the power of the heat source 99, although any other separation dimension range is contemplated.

Referring back to the assembly in FIG. 3B, the top surface of the manifold layer 106 is cut away to illustrate the channels 116, 122 and fingers 118, 120 within the body of the manifold layer 106. The locations in the heat source 99 that produce more heat are hereby designated as hot spots, whereby the locations in the heat source 99 which produce less heat are hereby designated as warm spots. As shown in FIG. 3B, the heat source 99 is shown to have a hot spot region, namely at location A, and a warm spot region, namely at location B. The areas of the interface layer 102 which abut the hot and warm spots are accordingly designated interface hot spot regions. As shown in FIG. 3B, the interface layer 102 includes interface hot spot region A, which is positioned above location A and interface hot spot region B, which is positioned above location B.

As shown in FIGS. 3A and 3B, fluid initially enters the heat exchanger 100 through one inlet port 108. The fluid then preferably flows to one inlet channel 116. Alternatively, the heat exchanger 100 includes more than one inlet channel 116. As shown in FIGS. 3A and 3B, fluid flowing along the inlet channel 116 from the inlet port 108 initially branches out to finger 118D. In addition, the fluid which continues along the rest of the inlet channel 116 flows to individual fingers 118B and 118C and so on.

In FIG. 3B, fluid is supplied to interface hot spot region A by flowing to the finger 118A, whereby fluid flows down through finger 118A to the intermediate layer 104. The fluid then flows through the inlet conduit 105A positioned below the finger 118A to the interface layer 102, whereby the fluid undergoes thermal exchange with the heat source 99. The fluid travels along the microchannels 110 as shown in FIG. 3B, although the fluid may travel in any other direction along the interface layer 102. The heated liquid then travels upward through the conduit 105B to the outlet finger 120A. Similarly, fluid flows down in the Z-direction through fingers 118E and 118F to the intermediate layer 104. The fluid then flows through the inlet conduit 105C down in the Z-direction to the interface layer 102. The heated fluid then travels upward in the Z-direction from the interface layer 102 through the outlet conduit 105D to the outlet fingers 120E and 120F. The heat exchanger 100 removes the heated fluid in the manifold layer 106 via the outlet fingers 120, whereby the outlet fingers 120 are in communication with the outlet channel 122. The outlet channel 122 allows fluid to flow out of the heat exchanger through one outlet port 109.

In one embodiment, the inflow and outflow conduits 105 are positioned directly or nearly directly above the appropriate interface hot spot regions to directly apply fluid to hot spots in the heat source 99. In addition, each outlet finger 120 is configured to be positioned closest to a respective inlet finger 119 for a particular interface hot spot region to minimize pressure drop therebetween. Thus, fluid enters the interface layer 102 via the inlet finger 118A and travels the least amount of distance along the bottom surface 103 of the interface layer 102 before it exits the interface layer 102 to the outlet finger 120A. It is apparent that the amount of distance which the fluid travels along the bottom surface 103 adequately removes heat generated from the heat source 99 without generating an unnecessary amount of pressure drop. In addition, as shown in FIGS. 3A and 3B, the corners in the fingers 118, 120 are curved to reduce pressure drop of the fluid flowing along the fingers 118.

It is apparent to one skilled in the art that the configuration of the manifold layer 106 shown in FIGS. 3A and 3B is only for exemplary purposes. The configuration of the channels 116 and fingers 118 in the manifold layer 106 depend on a number of factors, including but not limited to, the locations of the interface hot spot regions, amount of flow to and from the interface hot spot regions as well as the amount of heat produced by the heat source in the interface hot spot regions. For instance, the preferred configuration of the manifold layer 106 includes an interdigitated pattern of parallel inlet and outlet fingers that are arranged along the width of the manifold layer, as shown in FIGS. 4–7A and discussed below. Nonetheless, any other configuration of channels 116 and fingers 118 is contemplated.

Figure 4:
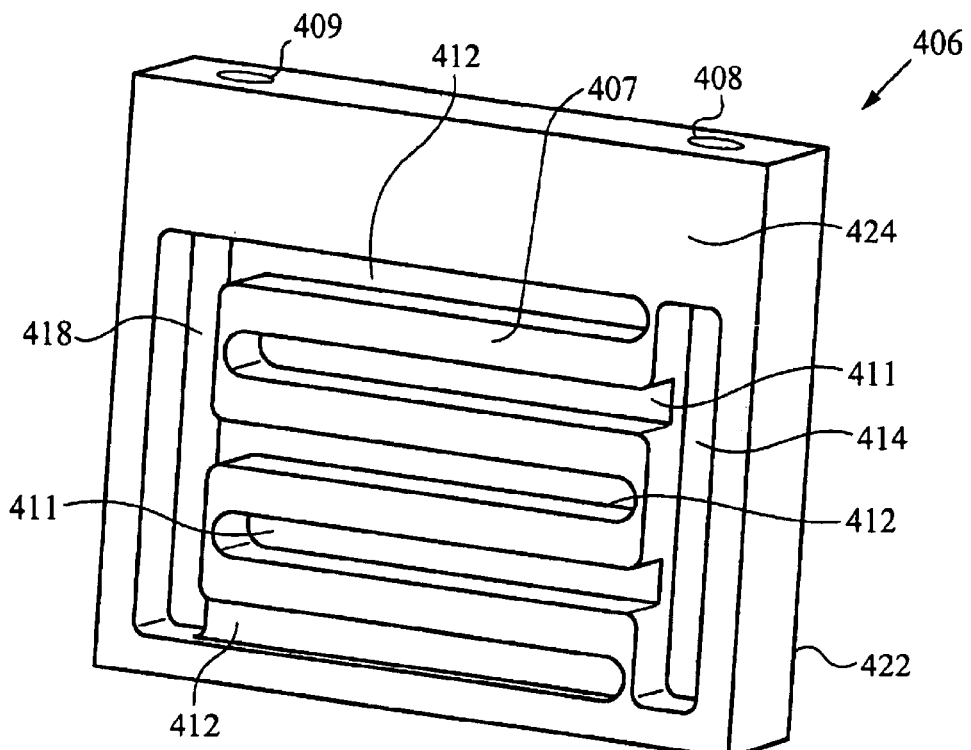
FIG. 4 illustrates a perspective view of the preferred interwoven manifold layer in accordance with the present invention.

FIG. 4 illustrates a perspective view of the preferred manifold layer 406 in accordance with the heat exchanger of the present invention. The manifold layer 406 in FIG. 4 preferably includes a plurality of interwoven or interdigitated parallel fluid fingers 411, 412 which allow one phase and/or two-phase fluid to circulate to the interface layer 402 without allowing a substantial pressure drop from occurring within the heat exchanger 400 and the system 30 (FIG. 2A). As shown in FIG. 8, the inlet fingers 411 are arranged alternately with the outlet fingers 412. However, it is contemplated by one skilled in the art that a certain number of inlet or outlet fingers can be arranged adjacent to one another and is thereby not limited to the alternating configuration shown in FIG. 4. In addition, the fingers are alternatively designed such that a parallel finger branches off from or is linked to another parallel finger. Thus, it is possible to have many more inlet fingers than outlet fingers and vice versa.

The inlet fingers or passages 411 supply the fluid entering the heat exchanger to the interface layer 402, and the outlet fingers or passages 412 remove the fluid from the interface layer 402 which then exits the heat exchanger 400. The preferred configuration of the manifold layer 406 allows the fluid to enter the interface layer 402 and travel a very short distance in the interface layer 402 before it enters the outlet passage 412. The substantial decrease in the length that the fluid travels along the interface layer 402 substantially decreases the pressure drop in the heat exchanger 400 and the system 30 (FIG. 2A).

Figure 5:
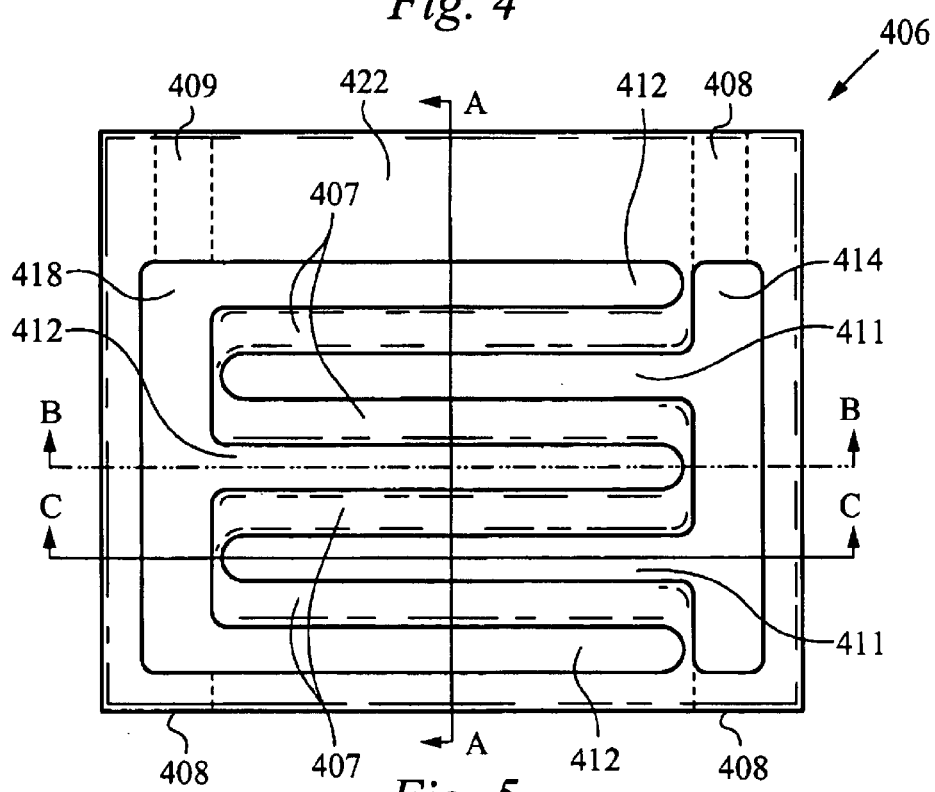
FIG. 5 illustrates a top view of the preferred interwoven manifold layer with interface layer in accordance with the present invention.

As shown in FIGS. 4–5, the preferred manifold layer 406 includes a passage 414 which is in communication with two inlet passages 411 and provides fluid thereto. As shown in FIGS. 8–9 the manifold layer 406 includes three outlet passages 412 which are in communication with passage 418. Preferably the passages 414 in the manifold layer 406 have a flat bottom surface which channels the fluid to the fingers 411, 412. Alternatively, the passage 414 has a slight slope which aids in channeling the fluid to selected fluid passages 411. Alternatively, the inlet passage 414 includes one or more apertures in its bottom surface which allows a portion of the fluid to flow down to the interface layer 402. Similarly, the passage 418 in the manifold layer has a flat bottom surface which contains the fluid and channels the fluid to the port 408. Alternatively, the passage 418 has a slight slope which aids in channeling the fluid to selected outlet ports 408. In addition, the passages 414, 418 have a dimension width of approximately 2 millimeters, although any other width dimensions are alternatively contemplated.

The passages 414, 418 are in communication with ports 408, 409 whereby the ports are coupled to the fluid lines 38 in the system 30 (FIG. 2A). The manifold layer 406 preferably includes horizontally configured fluid ports 408, 409. Alternatively, the manifold layer 406 includes vertically and/or diagonally configured fluid ports 408, 409, as discussed below, although not shown in FIG. 4–7. Alternatively, the manifold layer 406 does not include passage 414. Thus, fluid is directly supplied to the fingers 411 from the ports 408. Again, the manifold layer 411 alternatively does not include passage 418, whereby fluid in the fingers 412 directly flows out of the heat exchanger 400 through ports 408. It is apparent that although two ports 408 are shown in communication with the passages 414, 418, any other number of ports are alternatively utilized.

The inlet passages 411 preferably have dimensions which allow fluid to travel to the interface layer without generating a large pressure drop along the passages 411 and the system 30 (FIG. 2A). The inlet passages 411 preferably have a width dimension in the range of and including 0.25–5.00 millimeters, although any other width dimensions are alternatively contemplated. In addition, the inlet passages 411 preferably have a length dimension in the range of and including 0.5 millimeters to three times the length of the heat source. Alternatively, other length dimensions are contemplated. In addition, as stated above, the inlet passages 411 extend down to or slightly above the height of the microchannels 410 such that the fluid is channeled directly to the microchannels 410. The inlet passages 411 preferably have a height dimension in the range of and including 0.25–5.00 millimeters. It is apparent to one skilled in the art that the passages 411 do not extend down to the microchannels 410 and that any other height dimensions are alternatively contemplated. It is apparent to one skilled in the art that although the inlet passages 411 have the same dimensions, it is contemplated that the inlet passages 411 alternatively have different dimensions. In addition, the inlet passages 411 alternatively have varying widths, cross sectional dimensions and/or distances between adjacent fingers, varying dimensions. In particular, the passage 411 has areas with a larger width or depths as well as areas with narrower widths and depths along its length. The varied dimensions allow more fluid to be delivered to predetermined interface hot spot regions in the interface layer 402 through wider portions while restricting flow to warm spot interface hot spot regions through the narrow portions.

In addition, the outlet passages 412 preferably have dimensions which allow fluid to travel to the interface layer without generating a large pressure drop along the passages 412 as well as the system 30 (FIG. 2A). The outlet passages 412 preferably have a width dimension in the range of and including 0.25–5.00 millimeters, although any other width dimensions are alternatively contemplated. In addition, the outlet passages 412 preferably have a length dimension in the range of and including 0.5 millimeters to three times the length of the heat source. In addition, the outlet passages 412 extend down to the height of the microchannels 410 such that the fluid easily flows upward in the outlet passages 412 after horizontally flowing along the microchannels 410. The inlet passages 411 preferably have a height dimension in the range of and including 0.25–5.00 millimeters, although any other height dimensions are alternatively contemplated. It is apparent to one skilled in the art that although outlet passages 412 have the same dimensions, it is contemplated that the outlet passages 412 alternatively have different dimensions. Again, the inlet passage 412 alternatively have varying widths, cross sectional dimensions and/or distances between adjacent fingers.

The inlet and outlet passages 411, 412 are preferably segmented and distinct from one another, as shown in FIGS. 4 and 5, whereby fluid among the passages do not mix together. In particular, as shown in FIG. 8, two outlet passages are located along the outside edges of the manifold layer 406, and one outlet passage 412 is located in the middle of the manifold layer 406. In addition, two inlet passages 411 are configured on adjacent sides of the middle outlet passage 412. This particular configuration causes fluid entering the interface layer 402 to travel the a short distance in the interface layer 402 before it flows out of the interface layer 402 through the outlet passage 412. However, it is apparent to one skilled in the art that the inlet passages and outlet passages may be positioned in any other appropriate configuration and is thereby not limited to the configuration shown and described in the present disclosure. The number of inlet and outlet fingers 411, 412 are more than three within the manifold layer 406 but less than 10 per centimeter across the manifold layer 406. It is also apparent to one skilled in the art that any other number of inlet passages and outlet passages may be used and thereby is not limited to the number shown and described in the present disclosure.

Figure 6A:
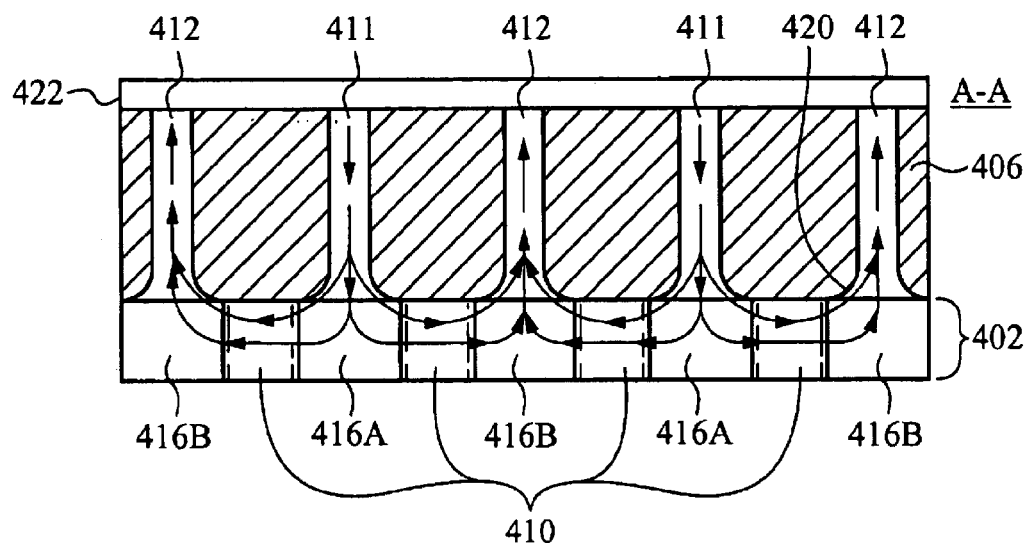
FIG. 6A illustrates a cross-sectional view of the preferred interwoven manifold layer with interface layer of the present invention along lines A—A.
Figure 6B:
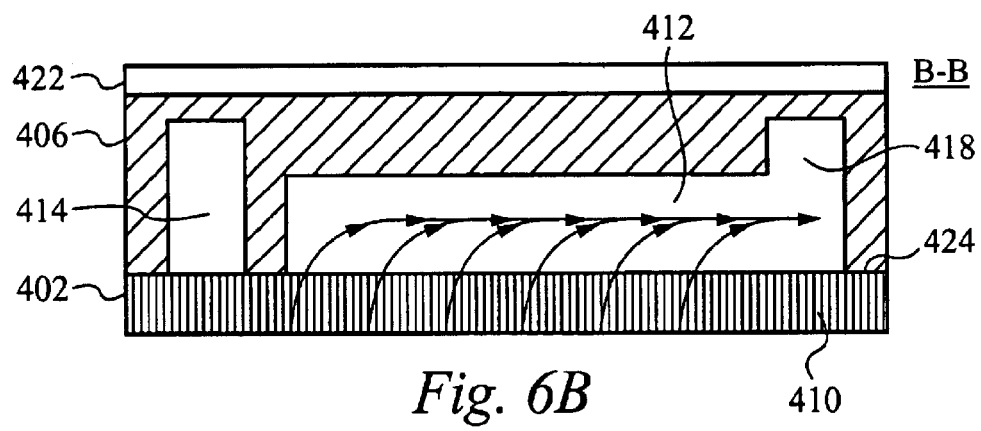
FIG. 6B illustrates a cross-sectional view of the preferred interwoven manifold layer with interface layer of the present invention along lines B—B.
Figure 6C:
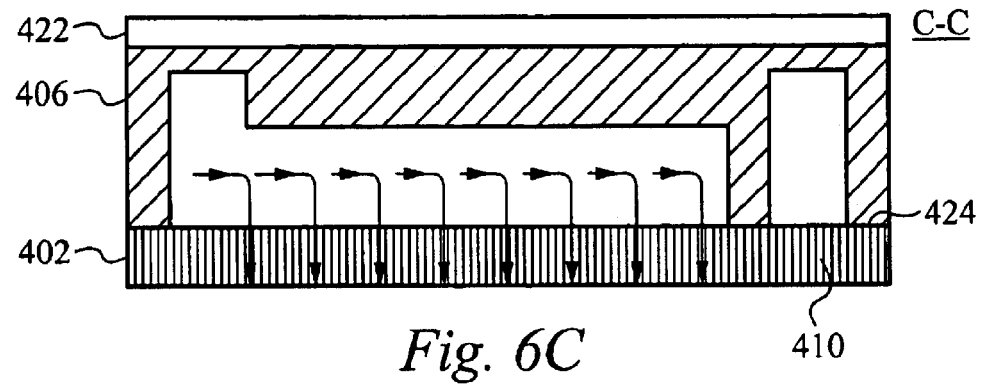
FIG. 6C illustrates a cross-sectional view of the preferred interwoven manifold layer with interface layer of the present invention along lines C—C.
Figure 7A:
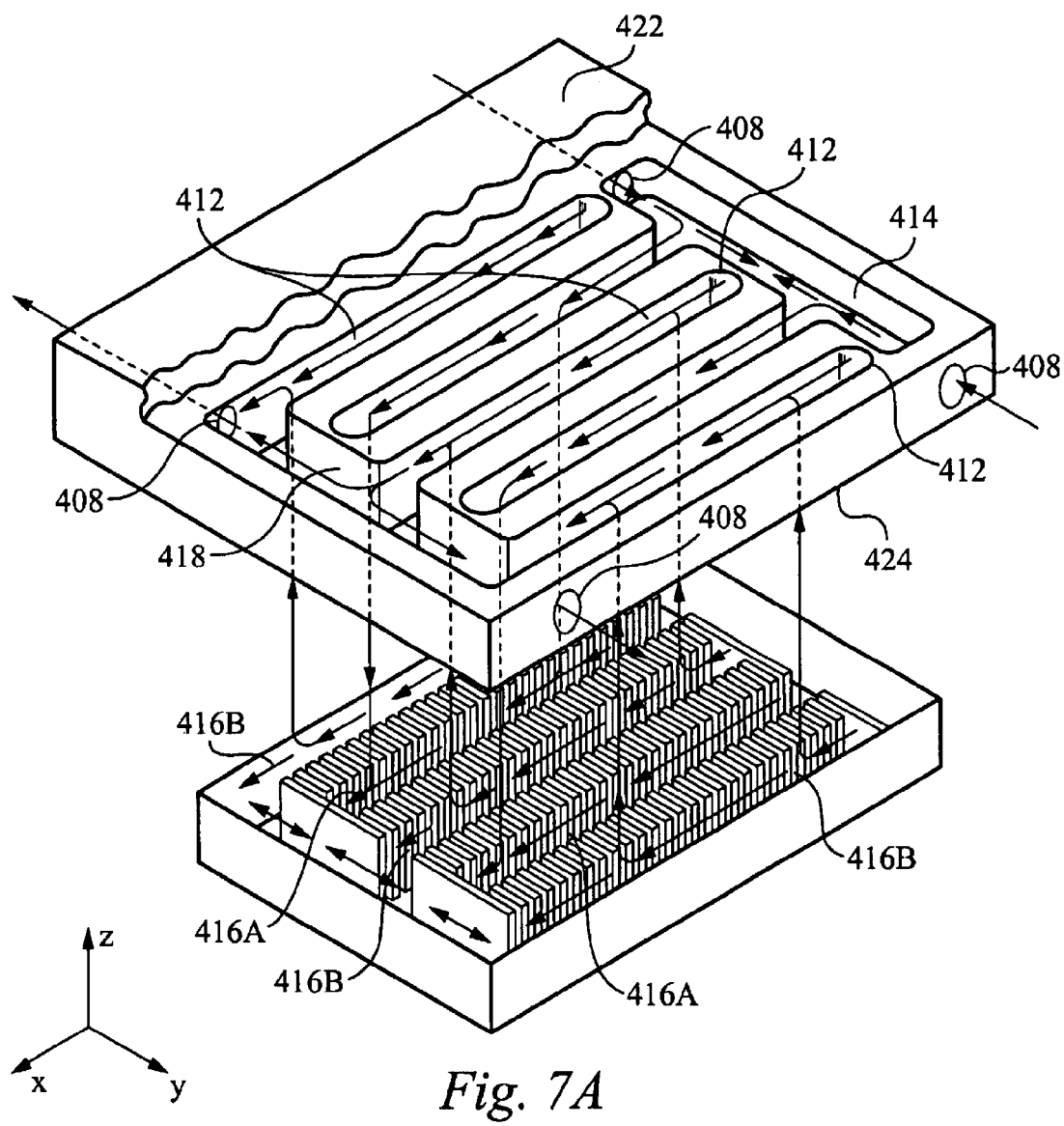
FIG. 7A illustrates an exploded view of the preferred interwoven manifold layer with interface layer of the present invention.

Preferably, the manifold layer 406 is coupled to the intermediate layer (not shown), whereby the intermediate layer (not shown) is coupled to the interface layer 402 to form a three-tier heat exchanger 400. The intermediate layer discussed herein is referred to above in the embodiment shown in FIG. 3B. The manifold layer 406 is alternatively coupled to the interface layer 402 and positioned above the interface layer 402 to form a two-tier heat exchanger 400, as shown in FIG. 7A. FIGS. 6A–6C illustrate cross-sectional schematics of the preferred manifold layer 406 coupled to the interface layer 402 in the two tier heat exchanger. Specifically, FIG. 6A illustrates the cross section of the heat exchanger 400 along line A—A in FIG. 5. In addition, FIG. 6B illustrates the cross section of the heat exchanger 400 along line B—B and FIG. 6C illustrates the cross section of the heat exchanger 400 along line C—C in FIG. 5. As stated above, the inlet and outlet passages 411, 412 extend from the top surface to the bottom surface of the manifold layer 406. When the manifold layer 406 and the interface layer 402 are coupled to one another, the inlet and outlet passages 411, 412 are at or slightly above the height of the microchannels 410 in the interface layer 402. This configuration causes the fluid from the inlet passages 411 to easily flow from the passages 411 through the microchannels 410. In addition, this configuration causes fluid flowing through the microchannels to easily flow upward through the outlet passages 412 after flowing through the microchannels 410.

In the preferred embodiment, the intermediate layer 104 (FIG. 3B) is positioned between the manifold layer 406 and the interface layer 402, although not shown in the figures. The intermediate layer 104 (FIG. 3B) channels fluid flow to designated interface hot spot regions in the interface layer 402. In addition, the intermediate layer 104 (FIG. 3B) is preferably utilized to provide a uniform flow of fluid entering the interface layer 402. Also, the intermediate layer 104 is preferably utilized to provide fluid to the interface hot spot regions in the interface layer 402 to adequately cool hot spots and create temperature uniformity in the heat source 99. Although, the inlet and outlet passages 411, 412 are preferably positioned near or above hot spots in the heat source 99 to adequately cool the hot spots, although it is not necessary.

FIG. 7A illustrates an exploded view of the alternate manifold layer 406 with the an alternative interface layer 102 of the present invention. Preferably, the interface layer 102 includes continuous arrangements of microchannel walls 110, as shown in FIG. 3B. In general operation, similar to the preferred manifold layer 106 shown in FIG. 3B, fluid enters the manifold layer 406 at fluid port 408 and travels through the passage 414 and towards the fluid fingers or passages 411. The fluid enters the opening of the inlet fingers 411 and preferably flows the length of the fingers 411 in the X-direction, as shown by the arrows. In addition, the fluid flows downward in the Z-direction to the interface layer 402 which is positioned below the manifold layer 406. As shown in FIG. 7A, the fluid in the interface layer 402 traverses along the bottom surface in the X and Y directions of the interface layer 402 and performs thermal exchange with the heat source 99. The heated fluid exits the interface layer 402 by preferably flowing upward in the Z-direction via the outlet fingers 412, whereby the outlet fingers 412 channel the heated fluid to the passage 418 in the manifold layer 406 in the X-direction. The fluid then flows along the passage 418 and exits the heat exchanger by flowing out through the port 409.

The interface layer, as shown in FIG. 7A, includes a series of grooves 416 disposed in between sets of microchannels 410 which aid in channeling fluid to and from the passages 411, 412. In particular, the grooves 416A are located directly beneath the inlet passages 411 of the alternate manifold layer 406, whereby fluid entering the interface layer 402 via the inlet passages 411 is directly channeled to the microchannels adjacent to the groove 416A. Thus, the grooves 416A allow fluid to be directly channeled into specific designated flow paths from the inlet passages 411, as shown in FIG. 5. Similarly, the interface layer 402 includes grooves 416B which are located directly beneath the outlet passages 412 in the Z-direction. Thus, fluid flowing horizontally along the microchannels 410 toward the outlet passages are channeled horizontally to the grooves 416B and vertically to the outlet passage 412 above the grooves 416B.

FIG. 6A illustrates the cross section of the heat exchanger 400 with the manifold layer 406 and the interface layer 402. In particular, FIG. 6A shows the inlet passages 411 interwoven with the outlet passages 412, whereby fluid flows down the inlet passages 411 and up the outlet passages 412. In addition, as shown in FIG. 6A, the fluid flows horizontally through the microchannel walls 410 which are disposed between the inlet passages and outlet passages and separated by the microchannels 410. Alternatively, the microchannel walls are continuous (FIG. 3B) and are not separated by the grooves. As shown in FIG. 6A, either or both of the inlet and outlet passages 411, 412 preferably have a curved surface 420 at their ends at the location near the grooves 416. The curved surface 420 directs fluid flowing down the passage 411 towards the microchannels 410 which are located adjacent to the passage 411. Thus, fluid entering the interface layer 102 is more easily directed toward the microchannels 410 instead of flowing directly to the groove 416A. Similarly, the curved surface 420 in the outlet passages 412 assists in directing fluid from the microchannels 410 to the outer passage 412.

Figure 7B:
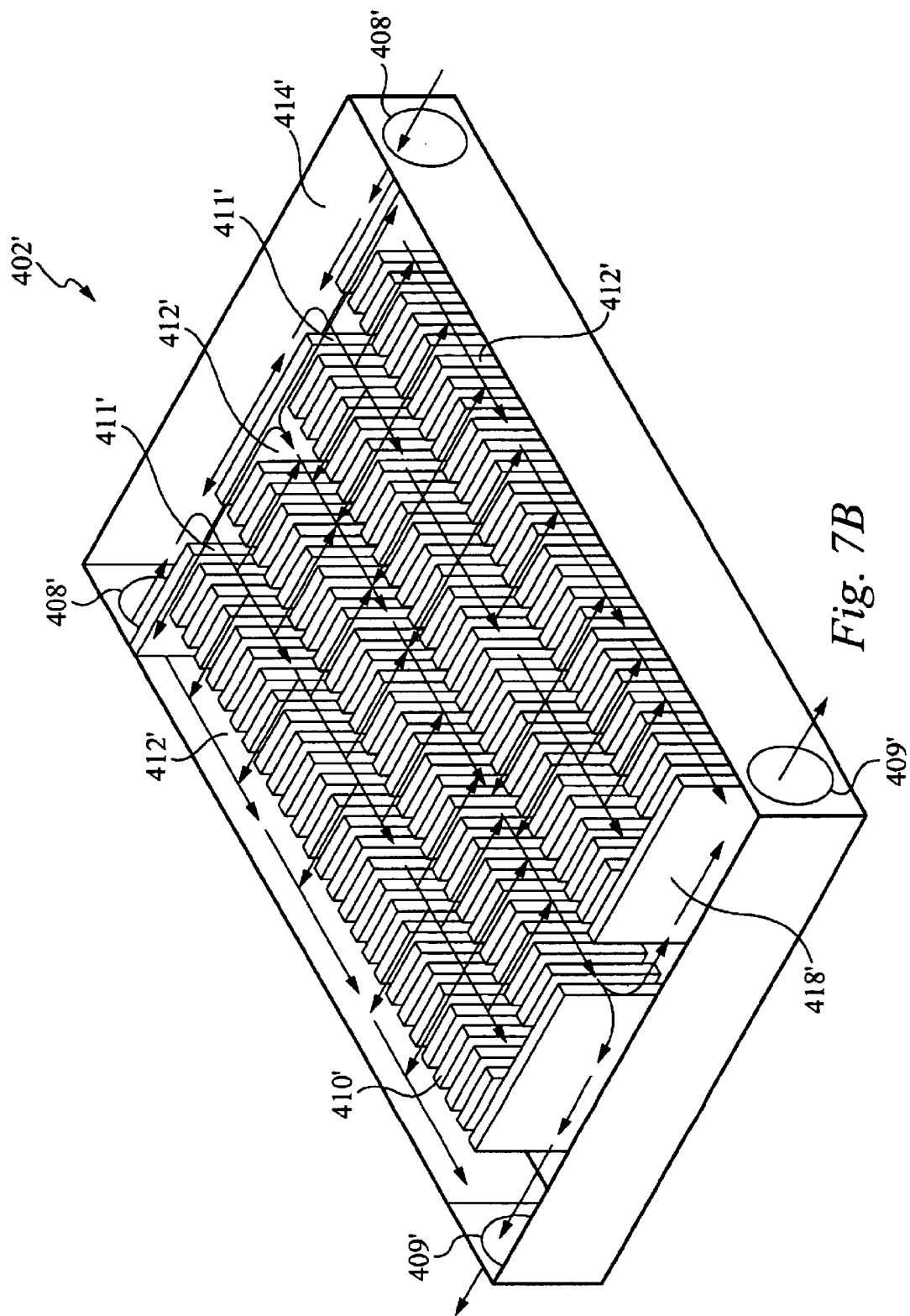
FIG. 7B illustrates a perspective view of an alternative embodiment of the interface layer of the present invention.

In an alternative embodiment, as shown in FIG. 7B, the interface layer 402' includes the inlet passages 411' and outlet passages 412' discussed above with respect to the manifold layer 406 (FIGS. 8–9). In the alternative embodiment, the fluid is supplied directly to the interface layer 402' from the port 408'. The fluid flows along the passage 414' towards the inlet passages 411'. The fluid then traverses laterally along the sets of microchannels 410' and undergoes heat exchange with the heat source (not shown) and flows to the outlet passages 412'. The fluid then flows along the outlet passages 412' to passage 418', whereby the fluid exits the interface layer 402' via the port 409'. The ports 408', 409' are configured in the interface layer 402' and are alternatively configured in the manifold layer 406 (FIG. 7A).

It is apparent to one skilled in the art that although all of the heat exchangers in the present application are shown to operate horizontally, the heat exchanger alternatively operates in a vertical position. While operating in the vertical position, the heat exchangers are alternatively configured such that each inlet passage is located above an adjacent outlet passage. Therefore, fluid enters the interface layer through the inlet passages and is naturally channeled to an outlet passage. It is also apparent that any other configuration of the manifold layer and interface layer is alternatively used to allow the heat exchanger to operate in a vertical position.

Figure 8A:
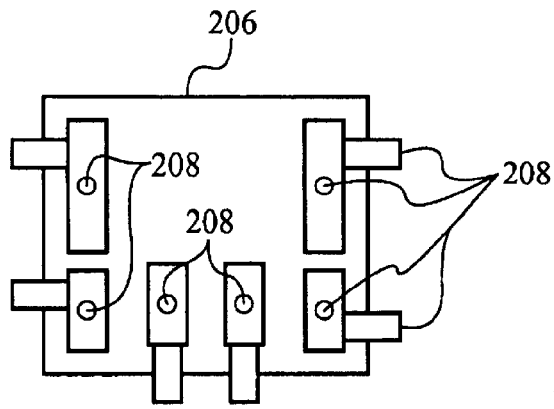
FIG. 8A illustrates a top view diagram of an alternate manifold layer in accordance with the present invention.
Figure 8B:
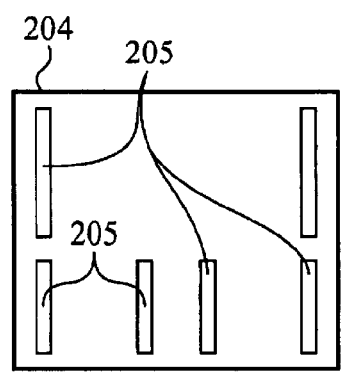
FIG. 8B illustrates a top view diagram of the interface layer in accordance with the present invention.
Figure 8C:
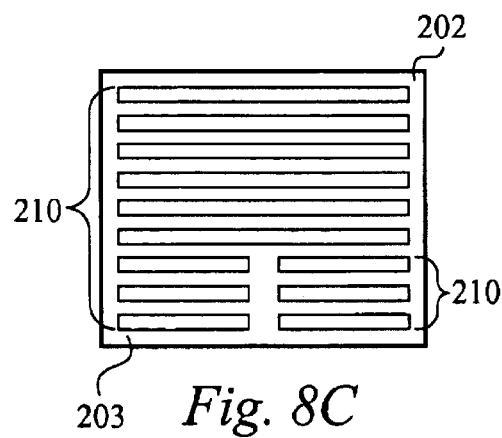
FIG. 8C illustrates a top view diagram of the interface layer in accordance with the present invention.

FIGS. 8A–8C illustrate top view diagrams of another alternate embodiment of the heat exchanger in accordance with the present invention. In particular, FIG. 8A illustrates a top view diagram of an alternate manifold layer 206 in accordance with the present invention. FIGS. 8B and 8C illustrate a top view of an intermediate layer 204 and interface layer 202. In addition, FIG. 9A illustrates a three tier heat exchanger utilizing the alternate manifold layer 206, whereas FIG. 9B illustrates a two-tier heat exchanger utilizing the alternate manifold layer 206.

Figure 9A:
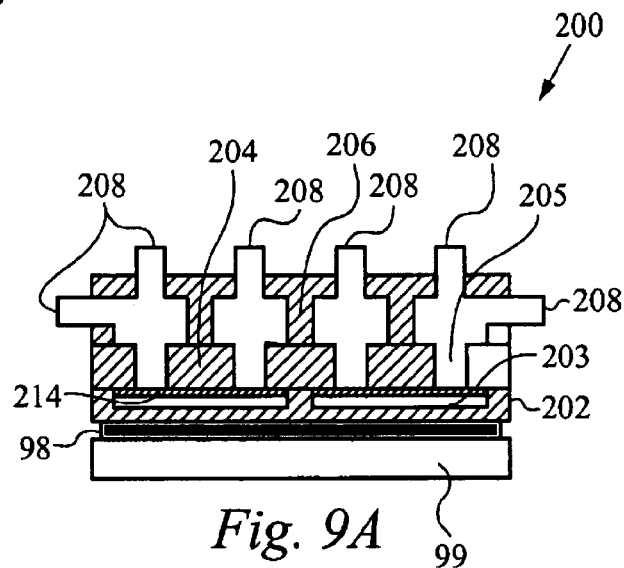
FIG. 9A illustrates a side view diagram of the alternative embodiment of the three tier heat exchanger in accordance with the present invention.
Figure 9B:
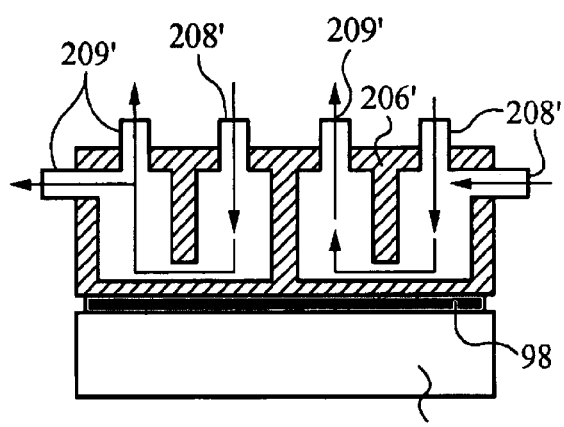
FIG. 9B illustrates a side view diagram of the alternative embodiment of the two tier heat exchanger in accordance with the present invention.

As shown in FIGS. 8A and 9A, the manifold layer 206 includes a plurality of fluid ports 208 configured horizontally and vertically. Alternatively, the fluid ports 208 are positioned diagonally or in any other direction with respect to the manifold layer 206. The fluid ports 208 are placed in selected locations in the manifold layer 206 to effectively deliver fluid to the predetermined interface hot spot regions in the heat exchanger 200. The multiple fluid ports 208 provide a significant advantage, because fluid can be directly delivered from a fluid port to a particular interface hot spot region without significantly adding to the pressure drop to the heat exchanger 200. In addition, the fluid ports 208 are also positioned in the manifold layer 206 to allow fluid in the interface hot spot regions to travel the least amount of distance to the exit port 208 such that the fluid achieves temperature uniformity while maintaining a minimal pressure drop between the inlet and outlet ports 208.

Additionally, the use of the manifold layer 206 aids in stabilizing two phase flow within the heat exchanger 200 while evenly distributing uniform flow across the interface layer 202. It should be noted that more than one manifold layer 206 is alternatively included in the heat exchanger 200, whereby one manifold layer 206 routes the fluid into and out-of the heat exchanger 200 and another manifold layer (not shown) controls the rate of fluid circulation to the heat exchanger 200. Alternatively, all of the plurality of manifold layers 206 circulate fluid to selected corresponding interface hot spot regions in the interface layer 202.

The alternate manifold layer 206 has lateral dimensions which closely match the dimensions of the interface layer 202. In addition, the manifold layer 206 has the same dimensions of the heat source 99. Alternatively, the manifold layer 206 is larger than the heat source 99. The vertical dimensions of the manifold layer 206 are within the range of 0.1 and 10 millimeters. In addition, the apertures in the manifold layer 206 which receive the fluid ports 208 are within the range between 1 millimeter and the entire width or length of the heat source 99.

Figure 11:
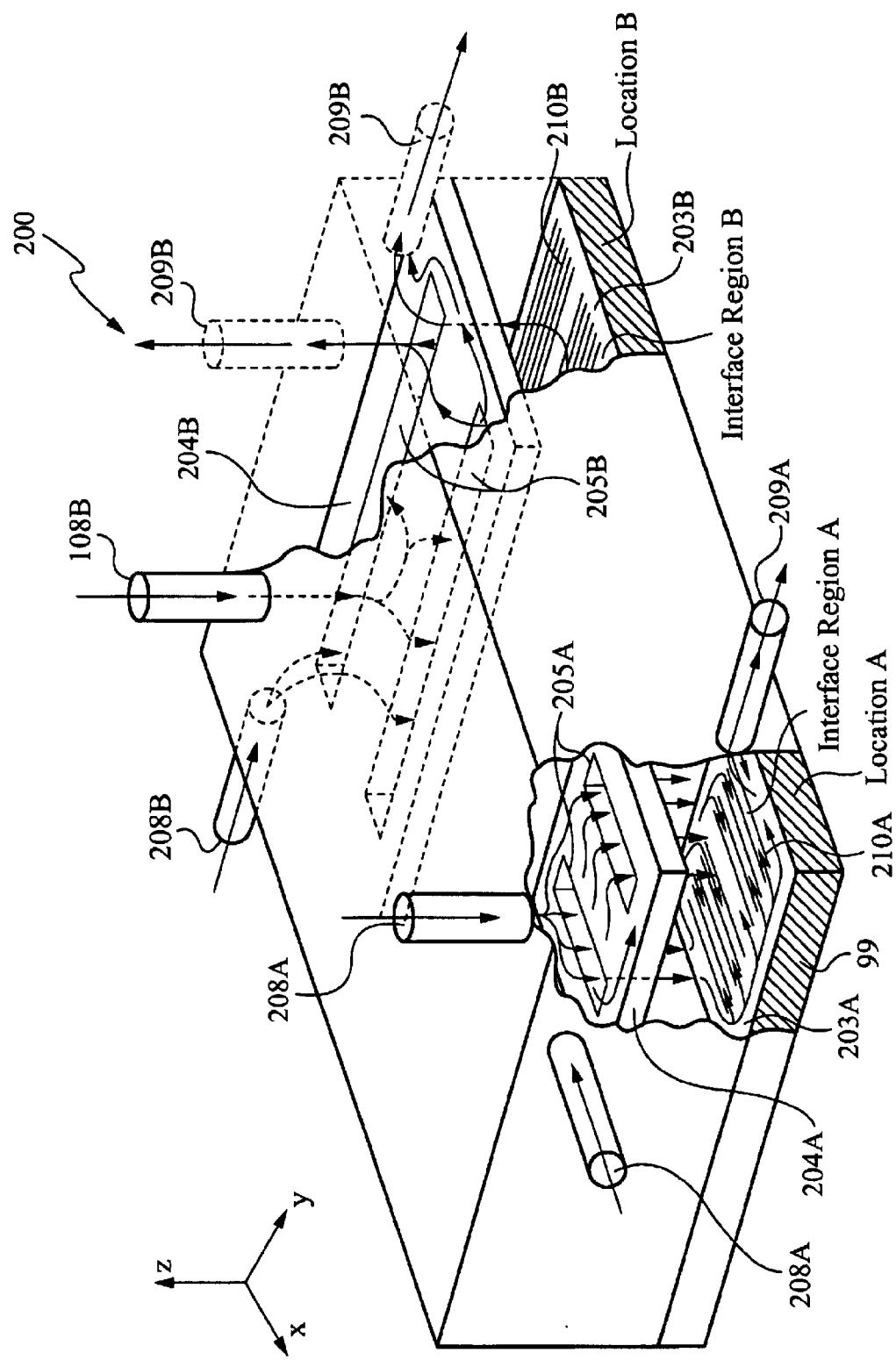
FIG. 11 illustrates a cut-away perspective view diagram of the alternate heat exchanger in accordance with the present invention.

FIG. 11 illustrates a broken-perspective view of a three tier heat exchanger 200 having the alternate manifold layer 200 in accordance with the present invention. As shown in FIG. 11, the heat exchanger 200 is divided into separate regions dependent on the amount of heat produced along the body of the heat source 99. The divided regions are separated by the vertical intermediate layer 204 and/or microchannel wall features 210 in the interface layer 202. However, it is apparent to one skilled in the art that the assembly shown in FIG. 11 is not limited to the configuration shown and is for exemplary purposes.

As shown in FIG. 3, the heat source 99 has a hot spot in location A and a warm spot, location B, whereby the hot spot in location A produces more heat than the warm spot in location B. It is apparent that the heat source 99 may have more than one hot spot and warm spot at any location at any given time. In the example, since location A is a hot spot and more heat in location A transfers to the interface layer 202 above location A (designated in FIG. 11 as interface hot spot region A), more fluid and/or a higher rate of liquid flow is provided to interface hot spot region A in the heat exchanger 200 to adequately cool location A. It is apparent that although interface hot spot region B is shown to be larger than interface hot spot region A, interface hot spot regions A and B, as well as any other interface hot spot regions in the heat exchanger 200, can be any size and/or configuration with respect to one another.

Alternatively, as shown in FIG. 11, the fluid enters the heat exchanger via fluid ports 208A is directed to interface hot spot region A by flowing along the intermediate layer 204 to the inflow conduits 205A. The fluid then flows down the inflow conduits 205A in the Z-direction into interface hot spot region A of the interface layer 202. The fluid flows in between the microchannels 210A whereby heat from location A transfers to the fluid by conduction through the interface layer 202. The heated fluid flows along the interface layer 202 in interface hot spot region A toward exit port 209A where the fluid exits the heat exchanger 200. It is apparent to one skilled in the art that any number of inlet ports 208 and exit ports 209 are utilized for a particular interface hot spot region or a set of interface hot spot regions. In addition, although the exit port 209A is shown near the interface layer 202A, the exit port 209A is alternatively positioned in any other location vertically, including but not limited to the manifold layer 209B.

Similarly, in the example shown in FIG. 11, the heat source 99 has a warm spot in location B which produces less heat than location A of the heat source 99. Fluid entering through the port 208B is directed to interface hot spot region B by flowing along the intermediate layer 204B to the inflow conduits 205B. The fluid then flows down the inflow conduits 205B in the Z-direction into interface hot spot region B of the interface layer 202. The fluid flows in between the microchannels 210 in the X and Y directions, whereby heat generated by the heat source in location B is transferred into the fluid. The heated fluid flows along the entire interface layer 202B in interface hot spot region B upward to exit ports 209B in the Z-direction via the outflow conduits 205B in the intermediate layer 204 whereby the fluid exits the heat exchanger 200.

Alternatively, as shown in FIG. 9A, the heat exchanger 200 alternatively includes a vapor permeable membrane 214 positioned above the interface layer 202. The vapor permeable membrane 214 is in sealable contact with the inner side walls of the heat exchanger 200. The membrane is configured to have several small apertures which allow vapor produced along the interface layer 202 to pass therethrough to the outlet port 209. The membrane 214 is also configured to be hydrophobic to prevent liquid fluid flowing along the interface layer 202 from passing through the apertures of the membrane 214. More details of the vapor permeable membrane 114 is discussed in co-pending U.S. application Ser. No. 10/366,128, filed Feb. 12, 2003 and entitled, "VAPOR ESCAPE MICROCHANNEL HEAT EXCHANGER" which is hereby incorporated by reference.

The microchannel heat exchanger of the present invention alternatively has other configurations not described above. For instance, the heat exchanger alternatively includes a manifold layer which minimizes the pressure drop within the heat exchanger in having separately sealed inlet and outlet apertures which lead to the interface layer. Thus, fluid flows directly to the interface layer through inlet apertures and undergoes thermal exchange in the interface layer. The fluid then exits the interface layer by flowing directly through outlet apertures arranged adjacent to the inlet apertures. This porous configuration of the manifold layer minimizes the amount of distance that the fluid must flow between the inlet and outlet ports as well as maximizes the division of fluid flow among the several apertures leading to the interface layer.

Figure 1A:
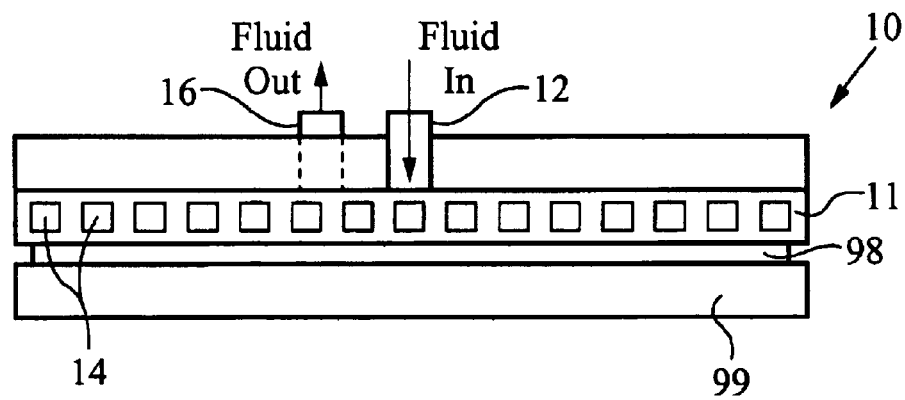
FIG. 1A illustrates a side view of a conventional heat exchanger.
Figure 1B:
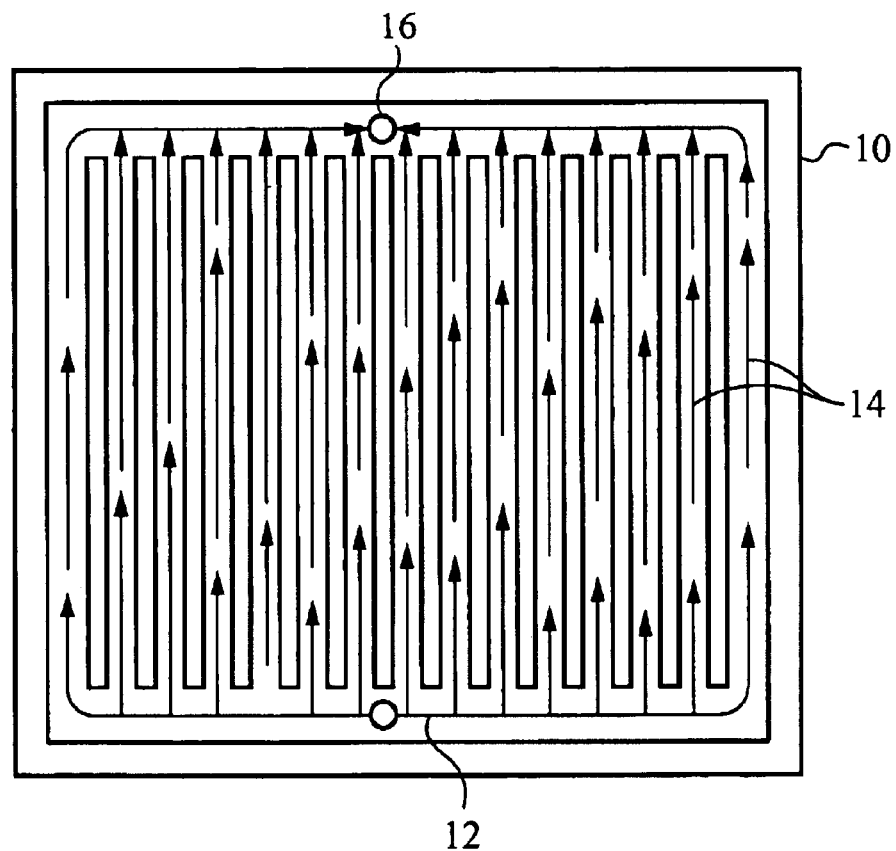
FIG. 1B illustrates a top view of the conventional heat exchanger.
Figure 1C:
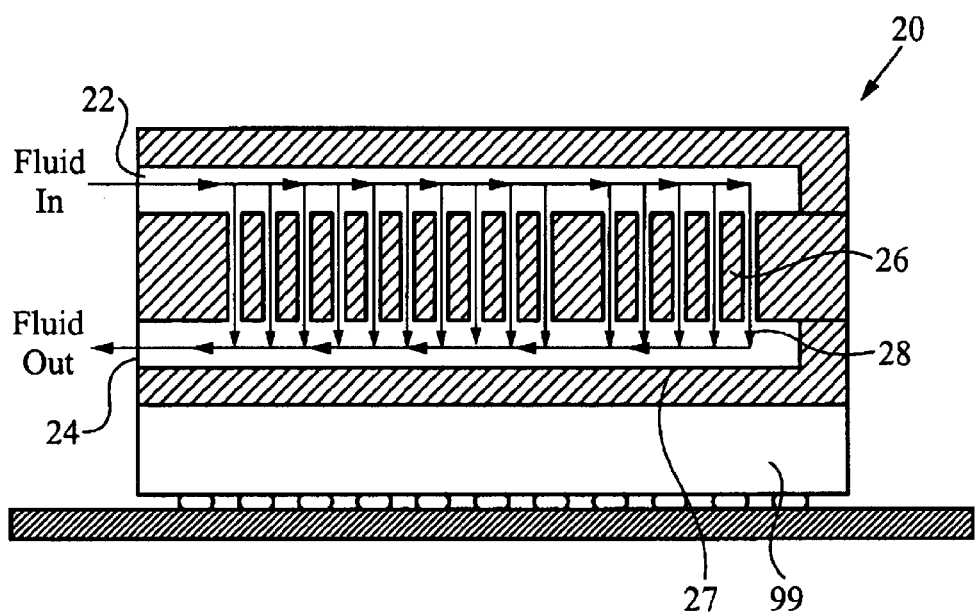
FIG. 1C illustrates a side view diagram of a prior art multi-level heat exchanger.

The details of how the heat exchanger 100 as well as the individual layers in the heat exchanger 100 are fabricated and manufactured are discussed below. The following discussion applies to the preferred and alternative heat exchangers of the present invention, although the heat exchanger 100 in FIG. 3B and individual layers therein are expressly referred to for simplicity. It is also apparent to one skilled in the art that although the fabrication/manufacturing details are described in relation to the present invention, the fabrication and manufacturing details also alternatively apply to conventional heat exchangers as well as two and three-tier heat exchangers utilizing one fluid inlet port and one fluid outlet port as shown in FIGS. 1A–1C.

Preferably, the interface layer 102 has a coefficient of thermal expansion (CTE) which is approximate or equal to that of the heat source 99. Thus, the interface layer 102 preferably expands and contracts accordingly with the heat source 99. Alternatively, the material of the interface layer 102 has a CTE which is different than the CTE of the heat source material. An interface layer 102 made from a material such as Silicon has a CTE that matches that of the heat source 99 and has sufficient thermal conductivity to adequately transfer heat from the heat source 99 to the fluid. However, other materials are alternatively used in the interface layer 102 which have CTEs that match the heat source 99.

The interface layer 102 in the heat exchanger 100 preferably has a high thermal conductivity for allowing sufficient conduction to pass between the heat source 99 and fluid flowing along the interface layer 102 such that the heat source 99 does not overheat. The interface layer 102 is preferably made from a material having a high thermal conductivity of 100 W/m-K. However, it is apparent to one skilled in the art that the interface layer 102 has a thermal conductivity of more or less than 100 W/m-K and is not limited thereto.

To achieve the preferred high thermal conductivity, the interface layer is preferably made from a semiconductor substrate, such as Silicon. Alternatively, the interface layer is made from any other material including, but not limited to single-crystalline dielectric materials, metals, aluminum, nickel and copper, Kovar, graphite, diamond, composites and any appropriate alloys. An alternative material of the interface layer 102 is a patterned or molded organic mesh.

Figure 12:
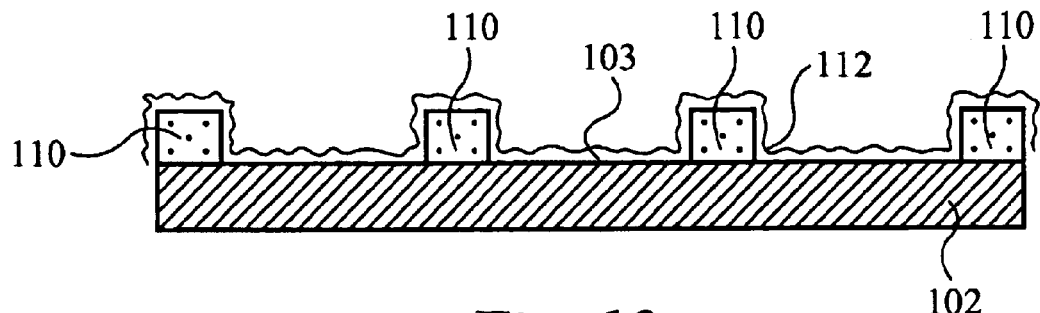
FIG. 12 illustrates a side view diagram of the interface layer of the heat exchanger having a coating material applied thereon in accordance with the present invention.

As shown in FIG. 12, it is preferred that the interface layer 102 is coated with a coating layer 112 to protect the material of the interface layer 102 as well as enhance the thermal exchange properties of the interface layer 102. In particular, the coating 112 provides chemical protection that eliminates certain chemical interactions between the fluid and the interface layer 102. For example, an interface layer 102 made from aluminum may be etched by the fluid coming into contact with it, whereby the interface layer 102 would deteriorate over time. The coating 112 of a thin layer of Nickel, approximately 25 microns, is thus preferably electroplated over the surface of the interface layer 102 to chemically pacify any potential reactions without significantly altering the thermal properties of the interface layer 102. It is apparent that any other coating material with appropriate layer thickness is contemplated depending on the material(s) in the interface layer 102.

In addition, the coating material 112 is applied to the interface layer 102 to enhance the thermal conductivity of the interface layer 102 to perform sufficient heat exchange with the heat source 99, as shown in FIG. 12. For example, an interface layer 102 having a metallic base covered with plastic can be thermally enhanced with a layer of Nickel coating material 112 on top of the plastic. The layer of Nickel has a thickness of at least 25 microns, depending on the dimensions of the interface layer 102 and the heat source 99. It is apparent that any other coating material with appropriate layer thickness is contemplated depending on the material(s) in the interface layer 102. The coating material 112 is alternatively used on material already having high thermal conductivity characteristics, such that the coating material enhances the thermal conductivity of the material. The coating material 112 is preferably applied to the bottom surface 103 as well as the microchannel walls 110 of the interface layer 102, as shown in FIG. 12. Alternatively, the coating material 112 is applied to either of the bottom surface 103 or microchannel walls 110. The coating material 112 is preferably made from a metal including, but not limited to, Nickel and Aluminum. However, the coating material 112 is alternatively made of any other thermally conductive material.

The interface layer 102 is preferably formed by an etching process using a Copper material coated with a thin layer of Nickel to protect the interface layer 102. Alternatively, the interface layer 102 is made from Aluminum, Silicon substrate, plastic or any other appropriate material. The interface layer 102 being made of materials having poor thermal conductivity are also coated with the appropriate coating material to enhance the thermal conductivity of the interface layer 102. One method of electroforming the interface layer is by applying a seed layer of chromium or other appropriate material along the bottom surface 103 of the interface layer 102 and applying electrical connection of appropriate voltage to the seed layer. The electrical connection thereby forms a layer of the thermally conductive coating material 112 on top of the interface layer 102. The electroforming process also forms feature dimensions in a range of 10–100 microns. The interface layer 102 is formed by an electroforming process, such as patterned electroplating. In addition, the interface layer is alternatively processed by photochemical etching or chemical milling, alone or in combination, with the electroforming process. Standard lithography sets for chemical milling are used to process features in the interface layer 102. Additionally, the aspect ratios and tolerances are enhanceable using laser assisted chemical milling processes.

The microchannel walls 110 are preferably made of Silicon. The microchannel walls 110 are alternatively made of any other materials including, but not limited to, patterned glass, polymer, and a molded polymer mesh. Although it is preferred that the microchannel walls 110 are made from the same material as that of the bottom surface 103 of the interface layer 102, the microchannel walls 110 are alternatively made from a different material than that of the rest of the interface layer 102.

It is preferred that the microchannel walls 110 have thermal conductivity characteristics of at least 20 W/m-K. Alternatively, the microchannel walls 110 have thermal conductivity characteristics of more than 20 W/m-K. It is apparent to one skilled in the art that the microchannel walls 110 alternatively have thermal conductivity characteristics of less than 20 W/m-K, whereby coating material 112 is applied to the microchannel walls 110, as shown in FIG. 12, to increase the thermal conductivity of the wall features 110. For microchannel walls 110 made from materials already having a good thermal conductivity, the coating 112 applied has a thickness of at least 25 microns which also protects the surface of the microchannel walls 110. For microchannel walls 110 made from material having poor thermal conductivity characteristics, the coating 112 has a thermal conductivity of at least 50 W/m-K and is more than 25 microns thick. It is apparent to one skilled in the art that other types of coating materials as well as thickness dimensions are contemplated.

To configure the microchannel walls 110 to have an adequate thermal conductivity of at least 20 W/m-K, the walls 110 are electroformed with the coating material 112 (FIG. 12), such as Nickel or other metal, as discussed above. To configure the microchannel walls 110 to have an adequate thermal conductivity of at least 50 W/m-K, the walls 110 are electroplated with Copper on a thin metal film seed layer. Alternatively, the microchannel walls 110 are not coated with the coating material.

The microchannel walls 110 are preferably formed by a hot embossing technique to achieve a high aspect ratio of channel walls 110 along the bottom surface 103 of the interface layer 102. The microchannel wall features 110 are alternatively fabricated as Silicon structures deposited on a glass surface, whereby the features are etched on the glass in the desired configuration. The microchannel walls 110 are alternatively formed by a standard lithography techniques, stamping or forging processes, or any other appropriate method. The microchannel walls 110 are alternatively made separately from the interface layer 102 and coupled to the interface layer 102 by anodic or epoxy bonding. Alternatively, the microchannel features 110 are coupled to the interface layer 102 by conventional electroforming techniques, such as electroplating.

There are a variety of methods that can be used to fabricate the intermediate layer 104. The intermediate layer is preferably made from Silicon. It is apparent to one skilled in the art that any other appropriate material is contemplated including, but not limited to glass, laser-patterned glass, polymers, metals, glass, plastic, molded organic material or any composites thereof. Preferably, the intermediate layer 104 is formed using plasma etching techniques. Alternatively, the intermediate layer 104 is formed using a chemical etching technique. Other alternative methods include machining, etching, extruding and/or forging a metal into the desired configuration. The intermediate layer 104 is alternatively formed by injection molding of a plastic mesh into the desired configuration. Alternatively, the intermediate layer 104 is formed by laser-drilling a glass plate into the desired configuration.

The manifold layer 106 is manufactured by a variety of methods. It is preferred that the manifold layer 106 is fabricated by an injection molding process utilizing plastic, metal, polymer composite or any other appropriate material, whereby each layer is made from the same material. Alternatively, as discussed above, each layer is made from a different material. The manifold layer 106 is alternatively generated using a machined or etched metal technique. It is apparent to one skilled in the art that the manifold layer 106 is manufactured utilizing any other appropriate method.

The intermediate layer 104 is coupled to the interface layer 102 and manifold layer 106 to form the heat exchanger 100 using a variety of methods. The interface layer 102, intermediate layer 104 and manifold layer 106 are preferably coupled to one another by an anodic, adhesive or eutectic bonding process. The intermediate layer 104 is alternatively integrated within features of the manifold layer 106 and interface layer 102. The intermediate layer 104 is coupled to the interface layer 102 by a chemical bonding process. The intermediate layer 104 is alternatively manufactured by a hot embossing or soft lithography technique, whereby a wire EDM or Silicon master is utilized to stamp the intermediate layer 104. The intermediate layer 104 is then alternatively electroplated with metal or another appropriate material to enhance the thermal conductivity of the intermediate layer 104, if needed.

Alternatively, the intermediate layer 104 is formed along with the fabrication of the microchannel walls 110 in the interface layer 102 by an injection molding process. Alternatively, the intermediate layer 104 is formed with the fabrication of the microchannel walls 110 by any other appropriate method. Other methods of forming the heat exchanger include, but are not limited to soldering, fusion bonding, eutectic Bonding, intermetallic bonding, and any other appropriate technique, depending on the types of materials used in each layer.

Figure 13:
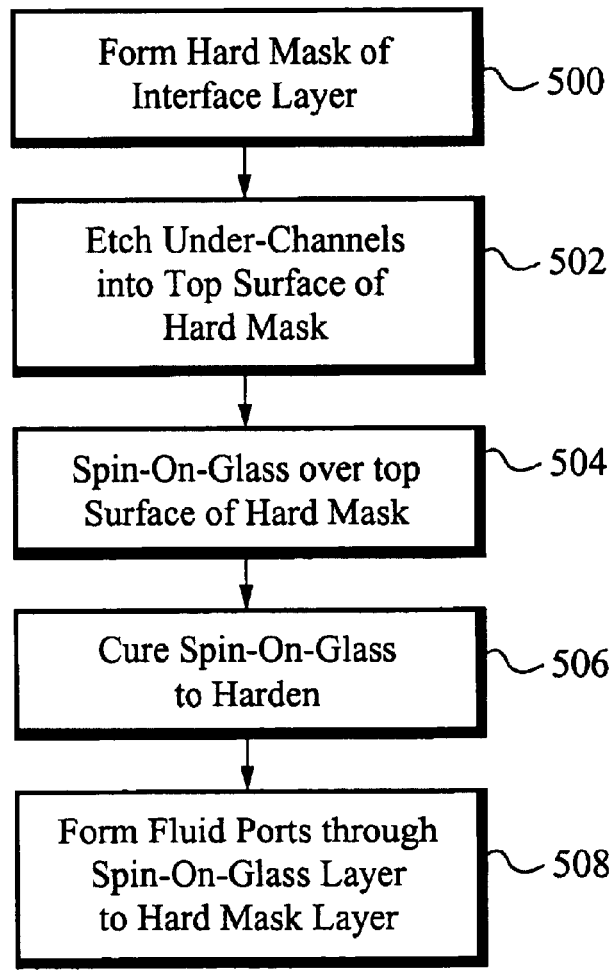
FIG. 13 illustrates a flow chart of an alternative method of manufacturing the heat exchanger in accordance with the present invention.

Another alternative method of manufacturing the heat exchanger of the present invention is described in FIG. 13. As discussed in relation to FIG. 13, an alternative method of manufacturing the heat exchanger includes building a hard mask formed from a silicon substrate as the interface layer (step 500). The hard mask is made from silicon dioxide or alternatively spin-on-glass. Once the hard mask is formed, a plurality of under-channels are formed in the hard mask, wherein the under-channels form the fluid paths between the microchannel walls 110 (step 502). The under-channels are formed by any appropriate method, including but not limited to HF etching techniques, chemical milling, soft lithography and xenon difluoride etch. In addition, enough space between each under-channel must be ensured such that under-channels next to one another do not bridge together. Thereafter, spin-on-glass is then applied by any conventional method over the top surface of the hard mask to form the intermediate and manifold layers (step 504). Following, the intermediate and manifold layers are hardened by a curing method (step 506). Once the intermediate and manifold layers are fully formed and hardened, one or more fluid ports are formed into the hardened layer (step 508). The fluid ports are etched or alternatively drilled into the manifold layer. Although specific methods of fabricating the interface layer 102, the intermediate layer 104 and manifold layer 106 are discussed herein, other known methods known in art to manufacture the heat exchanger 100 are alternatively contemplated.

Figure 14:
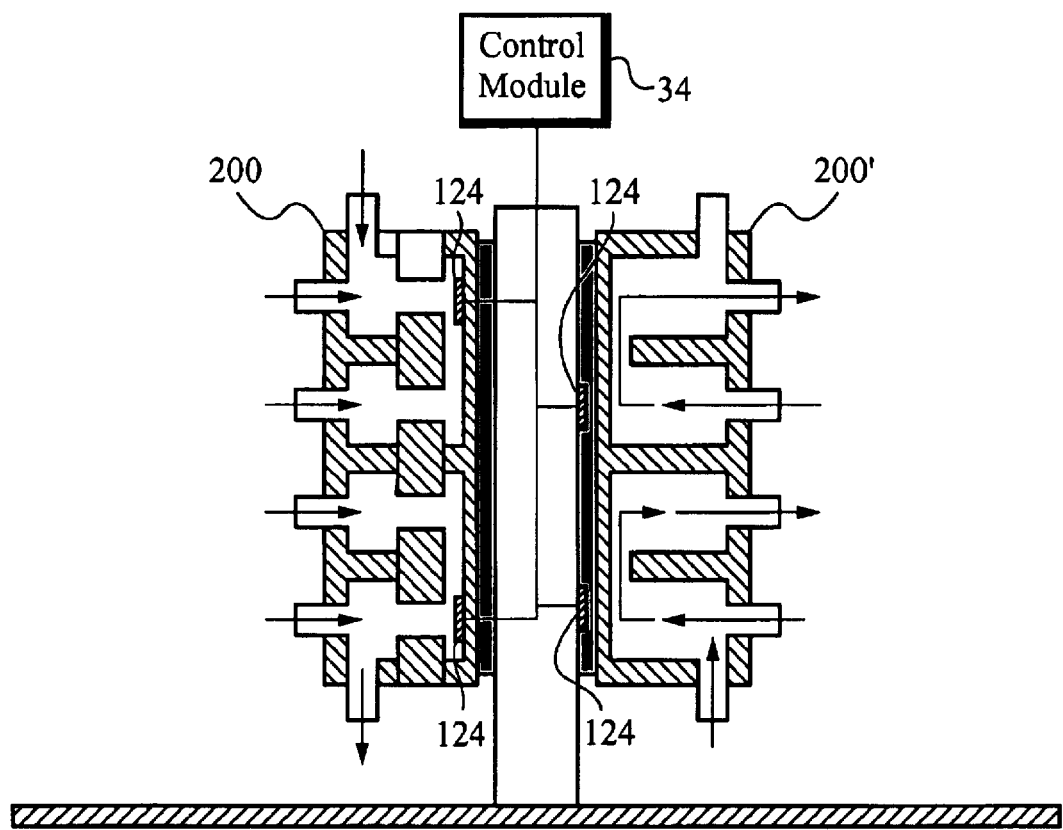
FIG. 14 illustrates a schematic of an alternate embodiment of the present invention having two heat exchangers coupled to a heat source.

FIG. 14 illustrates an alternative embodiment of the heat exchanger of the present invention. As shown in FIG. 6, two heat exchangers 200, 200' are coupled to one heat source 99. In particular, the heat source 99, such as an electronic device, is coupled to a circuit board 96 and is positioned upright, whereby each side of the heat source 99 is potentially exposed. A heat exchanger of the present invention is coupled to one exposed side of the heat source 99, whereby both heat exchangers 200, 200' provide maximum cooling of the heat source 99. Alternatively, the heat source is coupled to the circuit board horizontally, whereby more than one heat exchanger is stacked on top of the heat source 99 (not shown), whereby each heat exchanger is electrically coupled to the heat source 99. More details regarding this embodiment are shown and described in co-pending U.S. patent application Ser. No. 10/072,137, filed Feb. 7, 2002, entitled "POWER CONDITIONING MODULE" which is hereby incorporated by reference.

As shown in FIG. 14, the heat exchanger 200 having two layers is coupled to the left side of the heat source 99 and the heat exchanger 200' having three layers is coupled to the right side of the heat source 99. It is apparent to one skilled in the art that the preferred or alternative heat exchangers are coupled to the sides of the heat source 99. It is also apparent to one skilled in the art that the alternative embodiments of the heat exchanger 200' are alternatively coupled to the sides of the heat source 99. The alternative embodiment shown in FIG. 14 allows more precise hot spot cooling of the heat source 99 by applying fluid to cool hot spots which exist along the thickness of the heat source 99. Thus, the embodiment in FIG. 14 applies adequate cooling to hot spots in the center of the heat source 99 by exchanging heat from both sides of the heat source 99. It is apparent to one skilled in the art that the embodiment shown in FIG. 14 is used with the cooling system 30 in FIGS. 2A–2B, although other closed loop systems are contemplated.

As stated above, the heat source 99 may have characteristics in which the locations of one or more of the hot spots change due to different tasks required to be performed by the heat source 99. To adequately cool the heat source 99, the system 30 alternatively includes a sensing and control module 34 (FIGS. 2A–2B) which dynamically changes the amount of flow and/or flow rate of fluid entering the heat exchanger 100 in response to a change in location of the hot spots.

In particular, as shown in FIG. 14, one or more sensors 124 are placed in each interface hot spot region in the heat exchanger 200 and/or alternatively the heat source 99 at each potential hot spot location. Alternatively, a plurality of heat sources are uniformly placed in between the heat source and heat exchanger and/or in the heat exchanger itself. The control module 38 (FIG. 2A–2B) is also coupled to one or more valves in the loop 30 which control the flow of fluid to the heat exchanger 100. The one or more valves are positioned within the fluid lines, but are alternatively positioned elsewhere. The plurality of sensors 124 are coupled to the control module 34, whereby the control module 34 is preferably placed upstream from heat exchanger 100, as shown in FIG. 2. Alternatively, the control module 34 is placed at any other location in the closed loop system 30.

The sensors 124 provide information to the control module 34 including, but not limited to, the flow rate of fluid flowing in the interface hot spot region, temperature of the interface layer 102 in the interface hot spot region and/or heat source 99 and temperature of the fluid. For example, referring to the schematic in FIG. 14, sensors positioned on the interface 124 provide information to the control module 34 that the temperature in a particular interface hot spot region in heat exchanger 200 is increasing whereas the temperature in a particular interface hot spot region in heat exchanger 200' is decreasing. In response, the control module 34 increases the amount of flow to heat exchanger 200 and decreases the amount of flow provided to heat exchanger 200'. Alternatively, the control module 34 alternatively changes the amount of flow to one or more interface hot spot regions in one or more heat exchangers in response to the information received from the sensors 118. Although the sensors 118 are shown with the two heat exchangers 200, 200' in FIG. 14, it is apparent that the sensors 118 are alternatively coupled with only one heat exchanger.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A heat exchanger comprising:
   a. an interface layer for cooling a heat source, wherein the interface layer is configured to pass fluid therethrough, further wherein the interface layer includes a microporous structure disposed thereon; and
   b. a manifold layer for circulating fluid to and from the interface layer, the manifold layer having a first set fingers and a second set of fingers, wherein the first set of fingers are disposed in parallel with the second set of fingers and arranged to reduce pressure drop within the heat exchanger by reducing a length traveled by the fluid along the interface layer.

2. The heat exchanger according to claim 1 wherein the fluid is in single phase flow condition.

3. The heat exchanger according to claim 1 wherein the fluid is in two phase flow fluid conditions.

4. The heat exchanger according to claim 1 wherein at least a portion of the fluid undergoes a transition between single and two phase flow conditions in the interface layer.

5. The heat exchanger according to claim 1 wherein a particular finger in the first set is spaced apart by an appropriate dimension from a particular finger in the second set to minimize the pressure drop in the heat exchanger.

6. The heat exchanger according to claim 1 wherein each of the fingers have the same length and width dimensions.

7. The heat exchanger according to claim 1 wherein at least one of the fingers has a different dimension than the remaining fingers.

8. The heat exchanger according to claim 1 wherein the fingers are arranged non-periodically in at least one dimension in the manifold layer.

9. The heat exchanger according to claim 1 wherein at least one of the fingers has at least one varying dimension along a length of the manifold layer.

10. The heat exchanger according to claim 1 wherein the manifold layer includes more than three and less than 10 parallel fingers.

11. The heat exchanger according to claim 1 wherein the fingers in the first set and second set are alternately disposed along a dimension of the manifold layer.

12. The heat exchanger according to claim 1 wherein the manifold layer is configured to cool at least one interface hot spot region.

13. The heat exchanger according to claim 1 further comprising at least one first port in communication with the first set of fingers, wherein fluid enters the heat exchanger through the at least one first port.

14. The heat exchanger according to claim 13 further comprising at least one second port in communication with the second set of fingers, wherein fluid exits the heat exchanger through the at least one second port.

15. The heat exchanger according to claim 1 wherein the manifold layer is positioned above the interface layer, wherein fluid flows downward through the first set of fingers and upward though the second set of fingers.

16. The heat exchanger according to claim 13 further comprising a first port passage in communication with the first port and the first set of fingers, the first port passage configured to channel fluid from the first port to the first set of fingers.

17. The heat exchanger according to claim 16 further comprising a second port passage in communication with the second port and the second set of fingers, the second port passage configured to channel fluid from the second set of fingers to the second port.

18. The heat exchanger according to claim 1 wherein the interface layer is integrally formed with the heat source.

19. The heat exchanger according to claim 1 wherein the interface layer is coupled to the heat source.

20. The heat exchanger according to claim 1 further comprising an intermediate layer for channeling fluid to and from one or more predetermined positions in the interface layer via at least one conduit, the intermediate layer positioned between the interface layer and the manifold layer.

21. The heat exchanger according to claim 20 wherein the intermediate layer is coupled to the interface layer and the manifold layer.

22. The heat exchanger according to claim 20 wherein the intermediate layer is integrally formed with the interface layer and the manifold layer.

23. The heat exchanger according to claim 20 wherein the at least one conduit has at least one varying dimension along the intermediate layer.

24. The heat exchanger according to claim 1 wherein the interface layer includes a coating thereupon, wherein the coating provides an appropriate thermal conductivity of at least 20 W/m-K.

25. The heat exchanger according to claim 1 wherein the interface layer has a thermal conductivity is at least 20 W/m-K.

26. The heat exchanger according to claim 1 further comprising a plurality of pillars configured in a predetermined pattern along the interface layer.

27. The heat exchanger according to claim 1 wherein the interface layer has a roughened surface.

28. The heat exchanger according to claim 1 further comprises a plurality of microchannels configured in a predetermined pattern along the interface layer.

29. The heat exchanger according to claim 28 wherein the plurality of microchannels are coupled to the interface layer.

30. The heat exchanger according to claim 28 wherein the plurality of microchannels are integrally formed with the interface layer.

31. The heat exchanger according to claim 28 wherein the plurality of microchannels are divided into segmented arrays with at least one groove disposed therebetween, wherein the at least one groove is aligned with a corresponding finger.

32. The heat exchanger according to claim 28 wherein the plurality of microchannels include a coating thereupon, wherein the coating has an appropriate thermal conductivity of at least 20 W/m-K.

33. A heat exchanger for cooling a heat source comprising:
   a. a manifold layer including a first set of fingers in a first configuration, wherein each finger in the first set channels fluid at a first temperature, the manifold layer further including a second set of fingers in a second configuration, wherein each finger in the second set channels fluid at a second temperature, the first set and second set of fingers arranged parallel to each other and arranged to reduce pressure drop within the heat exchanger by reducing a length traveled by the fluid along an interface layer; and
   b. an interface layer configured to receive fluid at the first temperature at a plurality of first locations, wherein each first location is associated with a corresponding finger in the first set, the interface layer passing fluid along a plurality of predetermined paths to a plurality of second locations, wherein each second location is associated with a corresponding finger in the second set, further wherein the interface layer includes a micro-porous structure disposed thereon.

34. The heat exchanger according to claim 33 wherein the fluid is in single phase flow conditions.

35. The heat exchanger according to claim 33 wherein the fluid is in two phase flow conditions.

36. The heat exchanger according to claim 33 wherein at least a portion of the fluid undergoes a transition between single and two phase flow conditions in the interface layer.

37. The heat exchanger according to claim 33 wherein a particular finger in the first set is spaced apart by an appropriate dimension from a particular finger in the second set, wherein the appropriate dimension reduces the pressure drop in the heat exchanger.

38. The heat exchanger according to claim 33 further comprising at least one first port in communication with the first set of fingers, wherein fluid enters the heat exchanger through the at least one first port.

39. The heat exchanger according to claim 38 further comprising at least one second port in communication with the second set of fingers, wherein fluid exits the heat exchanger through the at least one second port.

40. The heat exchanger according to claim 33 wherein the manifold layer is positioned above the interface layer, wherein fluid flows downward through the first set of fingers and upward through the second set of fingers.

41. The heat exchanger according to claim 33 wherein the interface layer is integrally formed with the heat source.

42. The heat exchanger according to claim 33 wherein the interface layer is coupled to the heat source.

43. The heat exchanger according to claim 33 wherein the fingers in the first set are positioned in an alternating configuration with the fingers in the second set.

44. The heat exchanger according to claim 33 wherein each of the fingers have the same length and width dimensions.

45. The heat exchanger according to claim 33 wherein at least one of the fingers has a different dimension than the remaining fingers.

46. The heat exchanger according to claim 33 wherein the fingers are arranged non-periodically in at least one dimension in the manifold layer.

47. The heat exchanger according to claim 33 wherein at least one of the fingers has at least one varying dimension along a length of the manifold layer.

48. The heat exchanger according to claim 33 wherein the manifold layer includes more than three and less than 10 parallel fingers.

49. The heat exchanger according to claim 39 further comprising a first port passage in communication with the first port and the first set of fingers, the first port passage configured to channel fluid from the first port to the first set of fingers.

50. The heat exchanger according to claim 49 further comprising a second port passage in communication with the second port and the second set of fingers, the second port passage configured to channel fluid from the second set of fingers to the second port.

51. The heat exchanger according to claim 33 further comprising an intermediate layer for channeling fluid to and from one or more predetermined positions in the interface layer via at least one conduit, the intermediate layer positioned between the interface layer and the manifold layer.

52. The heat exchanger according to claim 51 wherein the conduit is arranged in a predetermined configuration to channel fluid to one or more interface hot spot regions in the interface layer.

53. The heat exchanger according to claim 51 wherein the conduit is arranged in a predetermined configuration to channel fluid from one or more interface hot spot regions in the interface layer.

54. The heat exchanger according to claim 51 wherein the intermediate layer is coupled to the interface layer and the manifold layer.

55. The heat exchanger according to claim 51 wherein the intermediate layer is integrally formed with the interface layer and the manifold layer.

56. The heat exchanger according to claim 51 wherein the conduit has at least one varying dimension in the intermediate layer.

57. The heat exchanger according to claim 33 wherein the interface layer includes a coating thereupon, wherein the coating provides an appropriate thermal conductivity of at least 20 W/m-K.

58. The heat exchanger according to claim 33 wherein the interface layer has a thermal conductivity is at least 20 W/m-K.

59. The heat exchanger according to claim 33 further comprising a plurality of pillars configured in a predetermined pattern along the interface layer.

60. The heat exchanger according to claim 33 wherein the interface layer has a roughened surface.

61. The heat exchanger according to claim 33 further comprises a plurality of microchannels configured in a predetermined pattern along the interface layer.

62. The heat exchanger according to claim 61 wherein the microchannels are coupled to the interface layer.

63. The heat exchanger according to claim 61 wherein the microchannels are integrally formed with the interface layer.

64. The heat exchanger according to claim 61 wherein the microchannels are divided into segments along a dimension of the interface layer, at least one groove disposed in between the divided microchannel segments.

65. The heat exchanger according to claim 61 wherein the microchannels are continuous along a dimension of the interface layer.

66. The heat exchanger according to claim 61 wherein the at least one groove is aligned with a corresponding finger.

67. The heat exchanger according to claim 61 wherein the plurality of microchannels include a coating thereupon, wherein the coating has an appropriate thermal conductivity of at least 20 W/m-K.

68. A manifold structure configureable to be coupled to a heat exchanger, wherein the heat exchanger is configured to cool a heat source, the manifold structure comprising: a first set of fingers for providing fluid at a first temperature to a heat exchange region of the heat exchanger, the heat exchanging region including a micro-porous structure disposed thereon, wherein the fluid in the heat exchange region performs thermal exchange with the heat source and flows toward a second set of fingers in the manifold structure at a second temperature, each finger disposed parallel to each other along a dimension and spaced apart by an appropriate distance to reduce pressure drop in the heat exchanger.

69. The manifold structure according to claim 68 wherein the fluid is in single phase flow conditions.

70. The manifold structure according to claim 68 wherein the fluid is in two phase flow conditions.

71. The manifold structure according to claim 68 wherein at least a portion of the fluid undergoes a transition between single and two phase flow conditions in the interface layer.

72. The manifold structure according to claim 68 wherein the heat exchange region is integrally formed with the heat source.

73. The manifold structure according to claim 68 wherein the heat exchange region is coupled to the heat source.

74. The manifold structure according to claim 68 further comprising at least one first port in communication with the first set of fingers, wherein fluid enters the manifold structure through the at least one first port.

75. The manifold structure according to claim 74 further comprising at least one second port in communication with the second set of fingers, wherein fluid exits the manifold structure through the at least one second port.

76. The manifold structure according to claim 68 wherein the manifold structure is positioned above the heat exchange region, wherein fluid flows downward to the heat exchange region via the first set of fingers and upward to the heat exchange region via the second set of fingers.

77. The manifold structure according to claim 68 further comprising a first port passage in communication with the first port and the first set of fingers, the first port passage configured to channel fluid from the first port to the first set of fingers.

78. The manifold structure according to claim 77 further comprising a second port passage in communication with the second port and the second set of fingers, the second port passage configured to channel fluid from the second set of fingers to the second port.

79. The manifold structure according to claim 68 further comprising an intermediate layer for channeling fluid to and from one or more predetermined positions in the heat exchange region via at least one conduit, the intermediate layer positioned between the manifold structure and the heat exchange region.

80. The manifold structure according to claim 79 wherein the conduit is arranged in a predetermined configuration to channel fluid to one or more hot spots in the heat exchange region.

81. The manifold structure according to claim 79 wherein the intermediate layer is coupled to the manifold structure.

82. The manifold structure according to claim 79 wherein the intermediate layer is integrally formed with the manifold structure.

83. The manifold structure according to claim 79 wherein the conduit has at least one varying dimension in the intermediate layer.

84. The manifold structure according to claim 8 wherein the heat exchange region includes a coating thereupon, wherein the coating provides an appropriate thermal conductivity of at least 20 W/m-K.

85. The manifold structure according to claim 68 wherein the at least one finger includes a varying dimension along the manifold structure.

86. The manifold structure according to claim 68 wherein each of the fingers have the same length and width dimensions.

87. The manifold structure according to claim 68 wherein at least one of the fingers has a different dimension than the remaining fingers.

88. The manifold structure according to claim 68 wherein the fingers are arranged non-periodically in at least one dimension in the manifold layer.

89. The manifold structure according to claim 68 wherein at least one of the fingers has at least one varying dimension along a length of the manifold layer.

90. An electronic device comprising:
 a. an integrated circuit;
 b. an interface layer integrally formed with the integrated circuit and configured to pass fluid therethrough, wherein the interface layer includes a micro-porous structure disposed thereon; and
 c. a manifold layer for circulating fluid with the interface layer, the manifold layer having a first set fingers and a second set of fingers, wherein the first set of fingers are disposed in parallel with the second set of fingers and arranged to reduce pressure drop within the electronic device by reducing a length traveled by the fluid along the interface layer.

91. An electronic device comprising:
 a. an integrated circuit;
 b. a manifold layer including a first set of fingers in a first configuration, wherein each finger in the first set channels fluid at a first temperature, the manifold layer further including a second set of fingers in a second configuration, wherein each finger in the second set channels fluid at a second temperature, the first set and second set of fingers arranged parallel to each other and also arranged to reduce fluid pressure drop by reducing a length traveled by the fluid along an interface layer; and
 c. the interface layer in contact with the integrated circuit, the interface layer configured to receive fluid at the first temperature at a plurality of first locations, wherein each first location is associated with a corresponding finger in the first set, the interface layer passing fluid along a plurality of predetermined paths to a plurality of second locations, wherein each second location is associated with a corresponding finger in the second set.

92. A closed loop system for cooling at least one integrated circuit comprising:
 a. at least one heat exchanger for absorbing heat generated by the integrated circuit, the heat exchanger further comprising:
  i. an interface layer in contact with the integrated circuit and configured to pass fluid therethrough, wherein the interface layer includes a micro-porous structure disposed thereon; and
  ii. a manifold layer coupled to the interface layer, the manifold layer having a first set fingers and a second set of fingers, wherein the first set of fingers are disposed in parallel with the second set of fingers and arranged to reduce pressure drop within the heat exchanger by reducing a length traveled by the fluid along the interface layer;
 b. at least one pump for circulating fluid throughout the loop, the pump coupled to the at least one heat exchanger; and
 c. at least one heat rejector coupled to the pump and the heat exchanger, the heat rejector for cooling heated liquid output from the heat exchanger.

93. A method of cooling a heat source, the method comprising:
 a. providing fluid at a first temperature to a heat exchange region via a first set of fingers in a first configuration;
 b. channeling the fluid along a plurality of flow paths along the heat exchange region, wherein the fluid is channeled to a second set of fingers in a second configuration, wherein the first and second configuration are arranged in parallel to minimize pressure drop there between by reducing a length traveled by the fluid along the heat exchange region; and
 c. removing fluid at a second temperature from the heat exchange region via the second set of fingers.

94. The method according to claim 93 wherein the first set and second set of fingers are disposed along the heat exchange region.

95. The method according to claim 93 wherein the first set and second set of fingers are disposed above the heat exchange region.

96. The method according to claim 93 wherein the at least one finger in the first set is arranged adjacent to at least one finger in the second set by an appropriate distance to reduce pressure drop therebetween.

* * * * *

UNITED STATES PATENT AND TRADEMARK OFFICE
CERTIFICATE OF CORRECTION

PATENT NO. : 6,986,382 B2  
APPLICATION NO. : 10/439912  
DATED : January 17, 2006  
INVENTOR(S) : Girish Upadhya et al.

Page 1 of 1

It is certified that error appears in the above-identified patent and that said Letters Patent is hereby corrected as shown below:

Column 1     Title Page # 56

IN THE REFERENCES CITED - U.S. PATENT DOCUMENTS - p. 3

Add --6,438,984 B1 8/2002 Novotny et al.--

Add --6,581,388 B2 6/2003 Novotny et al.--

Add --6,587,343 B2 7/2003 Novotny et al.--

Column 2     line 49     (Page 3)

IN THE REFERENCES CITED - OTHER PUBLICATIONS - p. 3

Replace "E. Esashi" with --M. Esashi--

Column 2     line 31     (Page 4)

IN THE REFERENCES CITED - OTHER PUBLICATIONS - p. 4

Replace "pic" with --plc--

Signed and Sealed this

Twenty-second Day of August, 2006

JON W. DUDAS  
*Director of the United States Patent and Trademark Office*